US011387382B2

(12) United States Patent
Eisenberg et al.

(10) Patent No.: US 11,387,382 B2
(45) Date of Patent: Jul. 12, 2022

(54) BIFACIAL PHOTOVOLTAIC CELL

(71) Applicants: Naftali Paul Eisenberg, Jerusalem (IL); Lev Kreinin, Bnei-Brak (IL)

(72) Inventors: Naftali Paul Eisenberg, Jerusalem (IL); Lev Kreinin, Bnei-Brak (IL)

(73) Assignee: SOLAROUND LTD., Jerusalem (IL)

( * ) Notice: Subject to any disclaimer, the term of this patent is extended or adjusted under 35 U.S.C. 154(b) by 0 days.

(21) Appl. No.: 17/355,194

(22) Filed: Jun. 23, 2021

(65) Prior Publication Data

US 2021/0328090 A1 Oct. 21, 2021

Related U.S. Application Data

(63) Continuation of application No. 15/767,649, filed as application No. PCT/IL2016/051148 on Oct. 25, 2016, now Pat. No. 11,075,316.

(Continued)

(51) Int. Cl.
*H01L 31/18* (2006.01)
*H01L 31/0216* (2014.01)
(Continued)

(52) U.S. Cl.
CPC ...... *H01L 31/1804* (2013.01); *H01L 21/2254* (2013.01); *H01L 21/2255* (2013.01);
(Continued)

(58) Field of Classification Search
CPC ............ H01L 31/1804; H01L 21/2254; H01L 21/2255; H01L 31/02167; H01L 31/02168;
(Continued)

(56) References Cited

U.S. PATENT DOCUMENTS 6,468,700 B1 * 10/2002 Takahashi ............... G03F 1/50
438/479
2003/0075717 A1 * 4/2003 Kondo ............ H01L 31/03685
257/E21.414

(Continued)

FOREIGN PATENT DOCUMENTS

CN 202189800 A1 4/2012
CN 102544195 A1 7/2012

(Continued)

OTHER PUBLICATIONS

Edler A et al: "Bifacial n-Type Solar Cells with Selective Boron Emitter", 28th European Photovoltaic Solar Energy Conference and Exhibition, EU PVSEC, Paris, France, Sep. 30, 2013 (Sep. 30, 2013), pp. 967-970, XP009175662, DOI: 10.4229/28THEUPVSEC2013-2CO.3.6 ISBN: 3-936338-33-7.

(Continued)

*Primary Examiner* — Charles D Garber
*Assistant Examiner* — S M Sohel Imtiaz
(74) *Attorney, Agent, or Firm* — Naomi Rosenman-Helfand

(57) ABSTRACT

The invention provides a bifacial photovoltaic cell comprising: a semiconductor substrate, the substrate comprising an n+ layer on a first surface, and a p+ layer on a second surface. The n+ layer comprises an n-dopant and the p+ layer comprises a p-dopant. The cell further comprises a passivating and/or antireflective coating on the doped first and second surfaces. The cell is characterized in that the second surface of the semiconductor substrate has an area substantially devoid of the p-dopant on an edge of the second surface having a width in the range of 0.1-0.5 mm; wherein the area is formed by etching the semiconductor substrate.

14 Claims, 4 Drawing Sheets

Related U.S. Application Data

(60) Provisional application No. 62/246,082, filed on Oct. 25, 2015.

(51) Int. Cl.
    | | | |
    |---|---|---|
    | *H01L 31/068* | (2012.01) | |
    | *H01L 21/225* | (2006.01) | |
    | *H01L 31/0288* | (2006.01) | |

(52) U.S. Cl.
    CPC .... *H01L 31/0288* (2013.01); *H01L 31/02167* (2013.01); *H01L 31/02168* (2013.01); *H01L 31/0684* (2013.01); *H01L 31/1868* (2013.01)

(58) Field of Classification Search
    CPC ............. H01L 31/0288; H01L 31/0684; H01L 31/1868; H01L 31/0216; H01L 31/032; H01L 31/0352; H01L 31/04; H01L 31/18; Y02E 10/547; Y02P 70/50
    See application file for complete search history.

(56) References Cited

U.S. PATENT DOCUMENTS

| | | | | |
|---|---|---|---|---|
| 2006/0278823 | A1* | 12/2006 | Tomita | G01N 23/22 |
| | | | | 250/282 |
| 2007/0177637 | A1* | 8/2007 | Koyama | G02F 1/216 |
| | | | | 372/29.013 |
| 2010/0243040 | A1* | 9/2010 | Kim | H01L 31/1804 |
| | | | | 257/E31.124 |
| 2010/0319763 | A1* | 12/2010 | Park | H01L 31/022425 |
| | | | | 257/E31.032 |
| 2011/0114147 | A1* | 5/2011 | Zaks | H01L 31/0288 |
| | | | | 136/255 |
| 2011/0232754 | A1* | 9/2011 | Myong | H01L 31/075 |
| | | | | 136/258 |
| 2011/0265870 | A1* | 11/2011 | Park | H01L 31/022425 |
| | | | | 136/256 |
| 2011/0315186 | A1* | 12/2011 | Gee | H01L 31/0682 |
| | | | | 257/E31.13 |
| 2012/0012179 | A1* | 1/2012 | Asaumi | H01L 31/0747 |
| | | | | 136/256 |
| 2013/0037102 | A1* | 2/2013 | Isaka | H01L 31/0682 |
| | | | | 257/E31.124 |
| 2013/0187207 | A1* | 7/2013 | Tang | H01L 29/785 |
| | | | | 257/288 |
| 2013/0192656 | A1* | 8/2013 | Hardin | H01L 31/02363 |
| | | | | 438/94 |
| 2013/0034467 | A1 | 12/2013 | Cheong | |
| 2015/0287591 | A1* | 10/2015 | Pore | H01L 21/0234 |
| | | | | 438/778 |
| 2016/0240724 | A1* | 8/2016 | Boescke | H01L 31/0684 |
| 2016/0351741 | A1* | 12/2016 | Zheng | H01L 31/02167 |
| 2017/0236963 | A1* | 8/2017 | Lefillastre | H01L 31/042 |
| | | | | 136/244 |

FOREIGN PATENT DOCUMENTS

| | | |
|---|---|---|
| DE | 2013-2196603 A1 | 2/2015 |
| DE | 20132018351 A1 | 3/2015 |
| DE | 10 2013 219603 | 4/2015 |
| JP | 2015-106624 A1 | 6/2015 |
| WO | 2011061693 A2 | 5/2011 |
| WO | 2011061694 | 5/2011 |
| WO | 2014101990 A1 | 7/2014 |

OTHER PUBLICATIONS

G. Grigorieva, M. Kagan, K. Zviagina, L. Kreinin, N. Bordin, N. Eisenberg: "Bifacial Si cells for space applications fabricated using combined ion implantation-thermal diffusion technology", BifiPV Workshop; Apr. 23 and 24, 2012; Konstanz, GermanyBifiPV Workshop; Apr. 23 and 24, 2012; Konstanz, Germany, 2012, pp. 1-15, XP009511410.

Edler A. et al.: "Bifacial n-type solar cell with selective boron emitter", Proceedings / EU PVSEC 2013, 28th European Photovoltaic Solar Energy Conference and Exhibition, Parc Des Expositions Paris, Nord Villepinte, Paris, France, Conference Sep. 30-Oct. 4, 2013, Exhibition Oct. 1-3, 2013 : The Most Inspiring PL, Dec. 16, 2013 (Dec. 16, 2013), pp. 1-21, XP040635245.

Duran Claudia, Bifacial Solar Cells: High Efficiency Design, Characterization, Modules and Applications, 2012, PhD Thesis, Retrieved from the Internet, <URL: http://d-nb.info/102641542X/34>.

* cited by examiner

BIFACIAL PHOTOVOLTAIC CELL

FIELD AND BACKGROUND OF THE INVENTION

The present invention, in some embodiments thereof, relates to bifacial cell fabrication and, more particularly, but not exclusively, to a method of cell structure formation on a silicon substrate with fine controllable boron doping and suppressed edge shunting.

There is considerable hope that conversion of sunlight into electricity by photovoltaic cells (PV) will provide a significant source of renewable energy in the future, thereby enabling a reduction in the use of non-renewable sources of energy, such as fossil fuels. However, to satisfy the worldwide demand for environmentally friendly renewable energy sources, the economics of the PV energy generation should be improved. Limited ability of energy generation per unit of solar cell area slows down photovoltaic cells use as a commercial source of electricity. Substitution of regular monofacial cells by bifacial cells allows increasing significantly (by 15-40%) the PV energy generation per area unit.

However there is a strong demand for further increasing the density of PV energy generation. This can be achieved by increase of front as well as of back bifacial cell efficiencies of sunlight conversion to electricity. Indeed, the photovoltaic cells should be inexpensive in the production.

Photovoltaic cells commonly comprise a p-type or n-type silicon substrate doped on one side thereof with an n-dopant (e.g., phosphorus) so as to form a $n^+$ layer, and doped on the other side thereof with a p-dopant (e.g., aluminum or boron) so as to form a $p^+$ layer, thereby forming a $n^+$-p-$p^+$ structure (when using a p-type substrate) or an $n^+$-n-$p^+$ structure (when using an n-type substrate).

Electrical contacts are then applied to each side. Electrical contacts must cover only a small fraction of the surface area in order to avoid impeding the passage of light. Electrical contacts are typically applied in a grid pattern in order to minimize covering of the surface area. Monofacial photovoltaic cells usually have such a grid pattern on only one side of the cell, whereas bifacial photovoltaic cells have such a pattern on both sides, and can therefore collect light from any direction.

Different methods of dopant source application are known. Gas phase processes using $POCl_3$ for phosphorus deposition and $BCl_3$ or $BBr_3$ for boron deposition are commonly used. Gas diffusion may easily result in doping of inappropriate regions, such as cross-doping of two dopant types in a single area. Additional steps involving deposition of protective layers and/or etching to remove dopant from some regions may be introduced [Buck et al., "Industrial Screen Printed n-Type Silicon Solar Cell with Front Boron Emitter and Efficiencies Exceeding 17%" *Proceedings of 21st European Photovoltaic Solar Energy Conference* 2006. p. 1264-1267], which complicate cell fabrication.

Geminus™ bifacial cells line (Schmid Group) has been prepared using chemical vapor deposition (CVD) for depositing the dopant-containing film.

To date, the best results in industrial production of p-type silicon-based bifacial cells were realized using a spin-on technique to deposit a dopant source [U.S. Pat. Nos. 8,586,862 and 8,796,060].

Kreinin et al. ["Industrially Fabricated Bifacial Si Solar Cells with $n^+$-p-$p^+$ Structure" *Proceedings of 28th European Photovoltaic Solar Energy Conference* 2013. p. 1835-1838] mentions that in order to obtain high efficiency bifacial solar cells, it is desirable to achieve low effective back surface recombination (which may be facilitated in an $n^+$-p-$p^+$ structure by a back p+ layer), as well as high minority carrier bulk lifetime, and describes p-type silicon-based bifacial cells using boron as a p-dopant which have an effective back surface recombination of 55-95 cm/second, and an average back to front short circuit current ratio of 0.75.

Boron is a well-known p-dopant, and has the advantage of being sufficiently soluble in silicon, thereby allowing a higher $p^+$-p barrier (in an $n^+$-p-$p^+$ structure) which is effective at reducing back surface recombination [Kreinin et al., *Proceedings of 28th European Photovoltaic Solar Energy Conference* 2013. p. 1835-1838]. However, boron diffusion is associated with considerable degradation of bulk lifetime, which reduces photovoltaic cell efficiency. This obstacle has encouraged the widespread use of aluminum as a p-dopant, although aluminum tends to be less effective than boron at reducing back surface recombination.

n-type silicon (in an $n^+$-n-$p^+$ structure) has also been used in order to reduce boron diffusion-associated degradation [Buck et al., *Proceedings of 21st European Photovoltaic Solar Energy Conference* 2006. p. 1264-1267]. Although n-type silicon is generally more resistant than p-type silicon to defects introduced by industrial processing, it is also more expensive.

Another problem in bifacial cell fabrication is that the use of different types of dopants (e.g., boron acceptor and phosphorus donor) may result in cross-doping of some regions of the wafer, especially at the edges, which can result in shunting. Techniques for avoiding edge shunting include laser edge isolation and edge etching, both of which are intended to avoid contact between the $n^+$ and $p^+$ layers.

U.S. Pat. Nos. 8,586,862 and 8,796,060 describe an intermediate step of removing a film comprising a p-dopant from the front side (i.e., the side to be n-doped) and edge of the substrate in order to reduce shunting, for example, by washing the front side with a washing solution (e.g., alcohol and water) using a spin-on method. This step may also remove the film from a 0.1 to 1 mm wide area bordering the edge of the substrate, such that the obtained $p^+$ layer of the photovoltaic cell does not cover an area bordering an edge of the substrate.

Additional background art includes Eisenberg et al. [*Energy Procedia* 2016, 92:16-23]. International Patent Application Publications WO2011/061693 and WO2011/061694, Russian Patent No. 2139601. U.S. Patent Application Publication No. 20110114152. U.S. Patent Application Publication No. 20080026550. U.S. Pat. No. 6,825,104. U.S. Pat. No. 6,552,414. U.S. Pat. No. 6,277,667. U.S. Pat. No. 6,180,869. U.S. Pat. Nos. 5,871,591, 4,989,059, German Patent No. 102007036921 and European Patent No. 1738402.

SUMMARY OF THE INVENTION

According to an aspect of some embodiments of the invention, there is provided a method of producing a bifacial photovoltaic cell, the method comprising:

a) forming an n-dopant-containing layer on a first surface of a semiconductor substrate;

b) forming a boron-containing layer on a second surface of the semiconductor substrate by sputtering boron and/or by boron ion implantation; and c) effecting diffusion of the n-dopant and diffusion of the boron into the semiconductor substrate, to thereby dope the first surface with the n-dopant and the second surface with the boron.

According to an aspect of some embodiments of the invention, there is provided a bifacial photovoltaic cell prepared according to the method described herein.

According to an aspect of some embodiments of the invention, there is provided a bifacial photovoltaic cell comprising a semiconductor substrate, the substrate comprising an n$^+$ layer on a first surface thereof and a p$^+$ layer on a second surface thereof, the n$^+$ layer comprising an n-dopant and the p$^+$ layer comprising boron, wherein a variability of boron concentration in the p$^+$ layer, as determined by measuring sheet resistance of the p$^+$ layer, is no more than 5%.

According to an aspect of some embodiments of the invention, there is provided a photovoltaic module comprising a plurality of a photovoltaic cell described herein, the plurality of photovoltaic cells being interconnected to one another.

According to an aspect of some embodiments of the invention, there is provided a power plant comprising a photovoltaic module described herein.

According to an aspect of some embodiments of the invention, there is provided an electric device comprising a photovoltaic cell described herein.

According to some embodiments of the invention, a thickness of the boron-containing layer is in a range of from 1 to 35 nm.

According to some embodiments of the invention, sputtering boron is effected using a boron nitride target.

According to some embodiments of the invention, the boron ion implantation is characterized by a dose in a range of from $10^{14}$ to $10^{16}$ implanted ions per cm$^2$.

According to some embodiments of the invention, a variability in an amount of boron in the boron-containing layer is no more than ±5%.

According to some embodiments of the invention, the method further comprises forming a cap layer above the boron-containing layer prior to effecting diffusion.

According to some embodiments of the invention, forming the cap layer is effected by depositing a substance selected from the group consisting of silicon oxide, silicon nitride and silicon oxynitride.

According to some embodiments of the invention, forming the cap layer is effected by radio frequency sputtering.

According to some embodiments of the invention, a thickness of the cap layer is in a range of from 5 to 30 nm.

According to some embodiments of the invention, the method further comprises:
d) removing the n-doped layer on the first surface by texturizing;
e) forming a passivating and/or antireflective coating on the second surface; and
f) subsequently doping the first surface with an n-dopant.

According to some embodiments of the invention, the method further comprises:
d) removing the n-doped layer on the first surface by texturizing and subsequently removing the cap layer;
e) forming a passivating and/or antireflective coating on the second surface; and
f) subsequently doping the first surface with an n-dopant.

According to some embodiments of the invention, subsequently doping the first surface with an n-dopant forms an n$^+$ layer characterized by a sheet resistance in a range of 70-150 ohms.

According to some embodiments of the invention, the method further comprises forming electrical contacts on each of the first surface and the second surface.

According to some embodiments of the invention, the boron-containing layer has a greater thickness in some regions of the second surface, the method comprising selectively forming electrical contacts on the aforementioned regions of the second surface.

According to some embodiments of the invention, the semiconductor substrate is a p-type semiconductor.

According to some embodiments of the invention, the semiconductor substrate comprises silicon.

According to some embodiments of the invention, the method further comprises forming a SiB layer on the second surface.

According to some embodiments of the invention, the method further comprises etching the second surface subsequent to step (a) and prior to step (b).

According to some embodiments of the invention, the method further comprises forming an area on an edge of the second surface, the area having a width in a range of 0.1-0.5 mm, which is substantially devoid of boron, by masking the area during step (b).

According to some embodiments of the invention, the method further comprises forming an area on an edge of the second surface, the area having a width in a range of 0.1-0.5 mm, which is substantially devoid of boron, by etching the area subsequent to step (b), optionally prior to step (c).

According to some embodiments of the invention, the etching of the abovementioned area is effected by reactive ion etching.

According to some embodiments of the invention, the diffusion of the n-dopant and the diffusion of the boron are effected simultaneously.

According to some embodiments of the invention, simultaneous diffusion of the n-dopant and the boron are effected by exposure to a temperature in a range of from 950° C. to 1050° C.

According to some embodiments of the invention, the boron-containing layer and conditions of diffusion are selected such that a surface concentration of boron in the second surface is less than $3 \cdot 10^{20}$ atoms/cm$^3$.

According to some embodiments of the invention, the boron-containing layer and conditions of diffusion are selected such that doping the second surface with boron forms a p$^+$ layer characterized by a thickness in a range of from 0.3 to 1.5 μm.

According to some embodiments of the invention, the boron-containing layer and conditions of diffusion are selected such that doping the second surface with boron forms a p$^+$ layer characterized by a sheet resistance in a range of from 30 to 150 ohms.

According to some embodiments of the invention, the n-dopant comprises phosphorus.

According to some embodiments of the invention, the first surface is texturized.

According to some embodiments of the invention, the photovoltaic cell described herein further comprises a passivating and/or antireflective coating on the second surface.

According to some embodiments of the invention, the n$^+$ layer in a cell described herein is characterized by a sheet resistance in a range of from 70 to 150 ohms.

According to some embodiments of the invention, the photovoltaic cell described herein further comprises electrical contacts on each of the first surface and the second surface, wherein a concentration of boron in the p$^+$ layer is greater in regions underlying the electrical contacts on the second surface.

According to some embodiments of the invention, the photovoltaic cell further comprises a SiB layer on the second surface.

According to some embodiments of the invention, a surface concentration of boron in the second surface of the cell is less than $10^{20}$ atoms/cm$^3$.

According to some embodiments of the invention, the second surface of the cell comprises from $10^{14}$ to $10^{16}$ boron atoms per cm$^2$.

According to some embodiments of the invention, the p$^+$ layer of the cell is characterized by a sheet resistance in a range of from 30 to 150 ohms.

According to some embodiments of the invention, the p$^+$ layer of the cell does not cover an area bordering an edge of the substrate, the area having a width in a range of 0.1-0.5 mm.

According to some embodiments of the invention, an effective back surface recombination of the photovoltaic cell is less than 50 cm/second.

According to some embodiments of the invention, the photovoltaic cell is characterized by a front side efficiency of at least 19%.

According to some embodiments of the invention, a ratio of back side short circuit current to front side short circuit current of the photovoltaic cell is at least 0.8.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method of embodiments of the invention can involve performing or completing selected tasks manually, automatically, or a combination thereof. Moreover, according to actual instrumentation and equipment of embodiments of the method of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In some embodiments of the invention, one or more tasks according to some embodiments of method as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DETAILED DESCRIPTION OF EMBODIMENTS OF THE INVENTION

Figure 1:
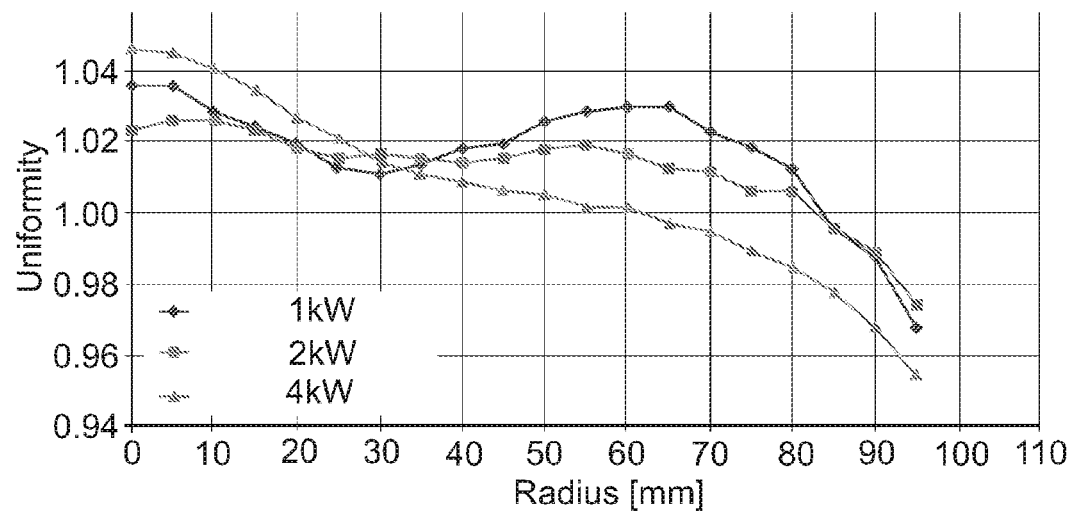
FIG. 1 is a graph showing the thickness uniformity (thickness normalized to average thickness) of boron nitride layers deposited on a square silicon substrate by sputtering at discharge powers of 1, 2 or 4 kW, in accordance with some embodiments of the invention, as a function of distance from the center of the substrate surface.

The present invention, in some embodiments thereof, relates to bifacial cell fabrication and, more particularly, but not exclusively, to a method of cell structure formation on a silicon substrate with fine controllable boron doping and suppressed edge shunting.

Before explaining at least one embodiment of the invention in detail, it is to be understood that the invention is not necessarily limited in its application to the details of construction and the arrangement of the components and/or methods set forth in the following description and/or illustrated and/or the Examples. The invention is capable of other embodiments or of being practiced or carried out in various ways.

The present inventors have recognized that the limited controllability of processes such as spin-on techniques for depositing doping sources tends to lead to over-doping of the doped layer, especially the boron-doped p$^+$ layer, and consequently results in increased recombination losses. The present inventors have further recognized that such increased recombination losses due to over-doping play a considerable role in limiting back to front short circuit current ratio in bifacial cells to about the average value of 0.75 reported by Kreinin et al. [*Proceedings of 28th European Photovoltaic Solar Energy Conference* 2013, p. 1835-1838], as well as the front efficiency to about 20-20.5%. Bulk recombination losses associated with over-doping can dominate total recombination losses, thereby rendering techniques for reducing surface recombination losses, such as surface passivation, relatively ineffective.

In a search for alternative methodologies for depositing a boron $p^+$ layer, the present inventors have uncovered that p-doping of a photovoltaic cell by using a sputtered boron-containing layer, and/or by boron ion implantation, with subsequent thermal treatment, advantageously allows formation of boron-doping at concentrations which are both relatively low, controllable and uniform, and thereby reduces detrimental effects associated with higher boron concentrations, as well as inefficiencies associated with variable dopant concentrations (e.g., parasitic current generation), while also retaining advantages of using boron as a p-dopant (such as a high solubility of boron in silicon, as compared, for example, with the widely used alloyed aluminum). By reducing bulk recombination losses (which are enhanced by over-doping), the methodology resulted in the surface playing a greater role in total recombination losses, which in turn allows techniques such as surface passivation to have greater efficacy in reducing total recombination losses and enhancing photovoltaic cell efficiency. In addition, the doping methodology uncovered by the inventors can minimize cross-doping and edge shunting, does not require complex procedures or high costs, and further allows for fine regulation of boron depth profile and reduction of recombination losses by surface passivation (which suppresses surface recombination, which is a more important factor at low dopant concentrations).

The present inventors have further uncovered that a cap layer (e.g., formed of silicon oxide, silicon nitride, silicon oxynitride and/or other inert substance) deposited above a boron-containing layer further enhances controllability of doping.

Without being bound by any particular theory, it is believed that the cap layer enhances stability of the boron-containing layer (which may be chemically unstable) by preventing reactions with oxygen, water and/or other atmospheric components. It is further believed that the cap layer reduces outwards diffusion of boron and undesirable cross-diffusion of phosphorus over the surface as well as near the wafer edges, and/or protects the $p^+$ layer against etching during etching/texturizing of the opposite side.

Embodiments of the present invention therefore relate to a novel method of producing a bifacial photovoltaic cell, which utilizes sputtering and/or ion implantation for forming a boron-containing layer on a surface of the semiconductor substrate that forms the cell. Some embodiments of the present invention further relate to forming a cap layer above the boron-containing layer.

Embodiments of the present invention further relate to a bifacial photovoltaic cell produced by a method as described herein. The bifacial photovoltaic cell is characterized by an $n^+$ layer on a first surface thereof, a boron-containing $p^+$ layer on a second surface thereof, with a low degree of variability in boron concentration in the $p^+$ layer (e.g., no more than 5%, as exemplified herein).

The Method:

According to an aspect of some embodiments of the invention, there is provided a method of producing a bifacial photovoltaic cell, the method comprising:

a) forming an n-dopant-containing layer on a first surface of a semiconductor substrate;

b) forming a boron-containing layer on a second surface of the semiconductor substrate by sputtering a boron-containing substance and/or by boron ion implantation; and c) effecting diffusion of said n-dopant and diffusion of said boron into the semiconductor substrate, to thereby dope said first surface with said n-dopant (e.g., so as to form an $n^+$ layer) and dope said second surface with said boron (e.g., so as to form a $p^+$ layer).

Forming an n-dopant-containing layer (step (a)) may optionally be effected prior to, concomitantly with and/or subsequently to forming a boron-containing layer (step (b)).

Herein the phrases "n-dopant containing layer" and "boron-containing layer" encompasses both layers which are not part of the substrate (e.g., layers of a substance deposited onto a surface of the substrate) as well as layers of the substrate which contain boron or n-dopant, for example, layers formed by ion implantation of boron or n-dopant in the substrate.

In contrast, the phrase "n-doped layer" refers herein to a portion of the semiconductor substrate which has been doped with an n-dopant (e.g., upon diffusion of an n-dopant from an n-dopant containing layer into the substrate), and the phrase "boron-doped layer" refers herein to a portion of the semiconductor substrate which has been doped with boron.

In some embodiments of any of the embodiments described herein, the n-dopant-containing layer is a phosphorus-containing layer.

In some embodiments of any of the embodiments described herein, the n-dopant-containing layer is formed by any suitable technique known in the art for forming such a layer, including, without limitation, sputtering (e.g., ion-beam sputtering, radio frequency (RF) sputtering, gas phase deposition, chemical vapor deposition (CVD), application of an n-dopant-containing solution (e.g., a phosphosilicate solution) or screen printing (e.g., of an n-dopant-containing paste). In some embodiments, the n-dopant-containing layer is a solid layer.

SiP and $P_2O_7Si$ are non-limiting examples of sputtering targets suitable for depositing a phosphorus-containing layer by ion-beam sputtering.

$POCl_3$ is a non-limiting example of a compound suitable for depositing a phosphorus-containing layer by gas phase deposition, optionally at a temperature in a range of from about 850 to about 950° C.

Spin-on and spraying are non-limiting examples of suitable techniques for applying a phosphosilicate solution.

In some embodiments of any of the embodiments described herein, the method further comprises removing the n-doped layer (e.g., an $n^+$ layer) on the first surface (also referred to herein as a "first n-doped layer" or "first $n^+$ layer"), optionally by etching (e.g., by texturizing the first surface), and subsequently doping the first surface with an n-dopant, thereby forming a second n-doped layer (e.g., a second $n^+$ layer). In some embodiments, n-dopant (if present) is also removed from the second surface by a process (e.g., etching) which removes (e.g., etches) n-doped portions of the substrate (e.g., n-doped silicon) more effectively than the boron-doped portions of the substrate (e.g., boron-doped silicon). e.g., in any embodiments described herein wherein n-dopant deposition on the second surface is not prevented by a cap layer.

In some embodiments, removing the n-doped layer (e.g., an $n^+$ layer) on the first surface is effected so as to concomitantly remove any n-doped layer (e.g., n-doped islands) present elsewhere (e.g., in a boron-doped region).

In some embodiments, etching (e.g., of an n-doped layer) is effected by an alkaline solution (e.g., a solution that comprises sodium hydroxide).

The second n-doped layer may optionally be formed by any suitable technique known in the art for n-doping (e.g., any n-doping technique described herein), including, without limitation, gas phase diffusion, ion implantation, and/or use of an n-dopant containing layer (e.g., according to any of the respective embodiments described herein).

Herein, in embodiments wherein a first n-doped layer and second n-doped layer are formed, the phrases "n-doped layer" and "$n^+$ layer" refers to the first n-doped layer, unless indicated otherwise.

In some embodiments of any of the embodiments described herein, a second $n^+$ layer prepared according to any of the respective embodiments described herein, or a first $n^+$ layer prepared according to any of the respective embodiments described herein which do not include preparing a second $n^+$ layer, is characterized by a sheet resistance in a range of from 70 to 150 ohms.

As used herein and in the art, the term "ohms" in the context of a sheet resistance is interchangeable with the terms "ohms per square" and "ohms/o", an accepted unit of sheet resistance which is used in the art to differentiate units of sheet resistance from units of bulk resistance (although ohm units and ohm per square units are dimensionally equal).

In some embodiments of any of the embodiments described herein, a second $n^+$ layer prepared according to any of the respective embodiments described herein has a greater sheet resistance than the first $n^+$ layer.

In some embodiments of any of the embodiments described herein, a first $n^+$ layer which is removed according to any of the respective embodiments described herein is characterized by a sheet resistance of less than 70 ohms, optionally less than 40 ohms, for example, in a range of from 8 to 25 ohms.

In some embodiments of any of the embodiments described herein, the method further comprises forming a passivating and/or antireflective coating on the second surface. In some such embodiments, forming a passivating and/or antireflective coating on the second surface is effected prior to, concomitantly with, and/or subsequently to forming effecting removal of a first n-doped layer according to any of the respective embodiments described herein, for example, such that the method further comprises:

d) removing the n-doped layer on the first surface by texturizing (according to any of the respective embodiments described herein), e) forming a passivating and/or antireflective coating on the second surface (according to any of the respective embodiments described herein); and f) subsequently to step (d), doping the first surface with an n-dopant (according to any of the respective embodiments described herein, wherein forming a passivating and/or antireflective coating (step (e)) may be effected at any stage. e.g., prior to step (d), between step (d) and step (f) and subsequent to step (f).

In some embodiments, doping the first surface with an n-dopant to form a second $n^+$ layer (e.g., step (f)) according to any of the respective embodiments described herein is effected subsequently to forming the passivating and/or antireflective coating on the second surface (e.g., step (e)). In some such embodiments, forming the passivating and/or antireflective coating (e.g., step e)) is effected subsequently to effecting removal of a first n-doped layer (e.g., step (d)) according to any of the respective embodiments described herein, e.g., so as not to interfere with removal of the first n-doped layer.

Herein, a "passivating and/or antireflective coating" refers to one or more dielectric coatings, each of which has a passivating effect and/or an antireflective effect.

Forming a passivating coating according to any of the respective embodiments described herein may optionally comprise (and optionally consist of) forming a SiB layer according to any of the respective embodiments described herein.

Additional examples of a passivating coating according to any of the respective embodiments described herein include, without limitation, layers of aluminum oxide (e.g., $Al_2O_3$) and/or silicon oxide.

A passivating and/or antireflective coating (e.g., an aluminum oxide, silicon oxide, silicon nitride and/or silicon oxynitride coating) may optionally be deposited (e.g., using sputtering and/or chemical vapor deposition) and/or formed by a reaction on the substrate surface, for example, by chemical and/or thermal oxidation of silicon in the substrate to form silicon oxide and/or diffusion of boron into silicon to form SiB (e.g., as described herein). The passivating and/or antireflective may have any suitable thickness (e.g., according to any of the respective embodiments described herein).

The terms "silicon nitride" and "SiN", which are used herein interchangeably, refer herein to a family of substances composed substantially of silicon and nitrogen, with various stoichiometries of Si and N (e.g., $Si_3N_4$), although some amounts of additional atoms (e.g., hydrogen) may be present as impurities.

The phrase "silicon oxynitride" refers to $SiN_xO_y$, wherein each of x and y is a positive number of up to 2 (e.g., between 0.1 and 2), and x and y are in accordance with the valence requirements of Si, N and O. Some amounts of additional atoms (e.g., hydrogen) may be present as impurities.

In some embodiments according to any of the respective embodiments described herein, the passivating and/or antireflective coating is formed such that a border of the passivating and/or antireflective coating corresponds to a desired border of a subsequently formed second n-doped layer (according to any of the respective embodiments described herein). The passivating and/or antireflective coating may optionally determine the border of a second n-doped layer by preventing n-doping across the border (i.e., in a region covered by the passivating and/or antireflective coating), for example, facilitating separation (i.e., reducing overlap) of an n-doped layer and a boron-doped layer, which can enhance shunt resistance.

In some embodiments according to any of the embodiments described herein, forming the passivating and/or antireflective coating is effected such that the passivating and/or antireflective coating covers an edge of the substrate (i.e., a surface between the first surface and the second surface, which is optionally perpendicular to each of the first surface and second surface), and optionally covers all of the edges of the substrate. In some such embodiments, the passivating and/or antireflective coating prevents formation of a second n-doped layer (according to any of the respective embodiments described herein) on an edge of the substrate.

In some embodiments of any of the embodiments described herein, diffusion of the n-dopant and diffusion of the boron are effected simultaneously. In some embodiments, simultaneous diffusion of n-dopant and boron are effected by heating, optionally by exposure to a temperature in a range of from 950° C. to 1050° C.

In some embodiments of any of the embodiments described herein, the boron-containing layer (e.g., the thickness, boron-concentration, and composition of the layer) and conditions of diffusion (e.g., temperature and/or time of diffusion) are selected such that a concentration of boron in said second surface is less than $10^{21}$ atoms/cm$^3$, optionally less than $3 \cdot 10^{20}$ atoms/cm$^3$, optionally less than $10^{20}$ atoms/cm$^3$, optionally less than $3 \cdot 10^{19}$ atoms/cm$^3$ and optionally less than $10^{19}$ atoms/cm$^3$.

Herein, a concentration at a surface of a substrate, in units of amount (e.g., atoms) per volume (e.g., cm$^3$ units) refers to a maximal concentration in a doped layer of the substrate (e.g., a maximal concentration at any depth up to a depth of about 1 μm).

In some embodiments of any of the embodiments described herein, the boron-containing layer (e.g., the thickness, boron-concentration, and composition of the layer) and conditions of diffusion (e.g., temperature and/or time of diffusion) are selected such that doping the second surface with boron forms an p$^+$ layer characterized by a sheet resistance according to any of the respective embodiments described herein, e.g., in a range of from 15 to 300 ohms, from 30 to 300 ohms, from 30 to 200 ohms and/or from 30 to 150 ohms.

The skilled person will be readily capable of modulating conditions (e.g., temperature and/or duration of thermal treatment, and/or amount of dopant in a dopant-containing layer) to arrive at a desired amount (e.g., concentration) of dopant (e.g., boron) and/or sheet resistance (which is affected by amount of dopant) in a surface of the substrate, according to any of the respective embodiments described herein.

In some embodiments of any of the embodiments described herein, the method further comprising forming a SiB layer on the second surface, for example, by diffusion of boron into a silicon-containing substrate according to any of the respective embodiments described herein.

In some embodiments of any of the embodiments described herein wherein an n-dopant-containing layer is formed prior to a boron-containing layer, the method further comprises etching the second surface subsequent to formation of the n-dopant-containing layer (e.g., step (a) described herein) and prior to formation of the boron-containing layer (e.g., step (b) described herein). In some embodiments, such etching is performed so as to remove any n-dopant-containing layer present on the second surface.

In some embodiments of any of the embodiments described herein wherein a boron-containing layer is formed prior to an n-dopant-containing layer, the method further comprises etching the first surface subsequent to formation of the boron-containing layer (e.g., step (b) described herein) and prior to formation of the n-dopant-containing layer (e.g., step (a) described herein). In some embodiments, such etching is performed so as to remove any boron-containing layer present on the first surface. In some such embodiments, the method further comprises forming a cap layer (according to any of the respective embodiments described herein) above the boron-containing layer on the second surface, for example, a cap layer selected to protect the boron-containing layer on the second surface during etching of the first surface.

In some embodiments of any of the embodiments described herein, the method further comprises forming an area on an edge (i.e., adjoining the edge) of the second surface which is substantially devoid of boron, the area having a width in a range of 0.1-0.5 mm.

In some embodiments, the boron-containing layer does not reach any edge of the second surface.

The abovementioned area on an edge of the surface may optionally be obtained by masking the area when forming a boron-containing layer (by masking the area from boron during sputtering or ion implantation) and/or by etching the area subsequent to forming the boron-containing layer (e.g., to remove the boron-containing area from the area).

In some embodiments, etching the area on the edge is effected by reactive ion etching. The etching may optionally be effected using a mask configured to etch only a narrow (e.g., 0.1 to 0.5 mm wide) area of the second surface.

In some embodiments, etching the area on the edge is effected prior to effecting diffusion of boron (e.g., step (c) as described herein), for example, to avoid any long-term effect of the boron-containing layer being even temporarily present at the edge of the surface prior to etching.

In some embodiments of any of the embodiments described herein, the method further comprises effecting a surface passivation treatment (e.g., a suitable surface passivation treatment known in the art). In some embodiments, the surface passivation treatment is effected by contact with a suitable agent (e.g., in solution). Quinhydrone (e.g., in a 3% solution) is an exemplary agent suitable for effecting passivation.

In some embodiments of any of the embodiments described herein, the method further comprises forming electrical contacts on each of the first surface and the second surface. Electric contacts may be formed according to methods well known in the art.

In order to allow light to reach the substrate of a bifacial photovoltaic cell, the contacts on both surfaces are preferably configured so as to allow most of the light to pass through to the substrate, thereby allowing the photovoltaic cell to produce electricity from illumination on either side of the cell. For example, the contacts may optionally be configured in a grid pattern.

In some embodiments, contacts are selectively formed (optionally using a mask) on regions of the second surface which have a greater concentration of boron than the rest of the second surface. In some embodiments, such regions are formed using a boron-containing layer which has a greater thickness and/or concentration in such regions (according to any of the respective embodiments described herein).

Boron-Containing Layer Formation:

According to the present embodiments, forming the boron-containing layer is effected by sputtering boron and/or by boron ion implantation, as described in further detail hereunder.

Herein throughout (with respect to any of the embodiments described herein) and in the art, the term "sputtering" refers to a process whereby particles are ejected from a target material (e.g., a solid material) due to bombardment of the target by energetic particles (e.g., ions). As is known in the art, at least a portion of the ejected material can deposit on a surface (e.g., a surface of a substrate in a vicinity of the target) to form a layer.

Herein throughout (with respect to any of the embodiments described herein) and in the art, "radio frequency sputtering" refers to sputtering whereby a sputtering target may optionally be subjected to a charged plasma particles, such as ionized gas (optionally using strong electric and/or magnetic fields to direct plasma particles in the general location of the target), with an alternating voltage bias (e.g., alternating at a radio frequency, such as 13.56 MHz) accelerating the plasma particles.

Herein throughout (with respect to any of the embodiments described herein) and in the art, "ion-beam sputtering" refers to sputtering whereby an ion beam is directed towards a sputtering target (to thereby bombard the target), and accelerated ions in the ion beam are neutralized (by an electron source) such that the target is bombarded by neutrally charged particles.

Herein throughout, the phrases "sputtering boron". "boron sputtering" and the like refer to sputtering in which the particles ejected in sputtering comprise boron.

Herein throughout (with respect to any of the embodiments described herein) and in the art, the term "ion implantation" refers to a process in which ions (e.g., boron ions) are accelerated by an electrical field and impacted into a solid material (e.g., into a substrate described herein, according to any of the respective embodiments). When the ion velocity is sufficiently high, the ions can become embedded in the impacted material. e.g., by changing a crystal structure of the impacted solid material.

In some embodiments of any of the embodiments described herein relating to sputtering boron, a solid layer containing boron is deposited on the second surface by sputtering.

Any suitable technique known in the art for sputtering boron (e.g., by sputtering a boron-containing material) onto a surface may optionally be used.

Boron nitride is a non-limiting example of a suitable (boron-containing) target for sputtering boron.

The ions used for sputtering (e.g., sputtering boron) may optionally be inert (e.g., N, Ar) and/or active (e.g., O). In some embodiments, an active ion (e.g., O) is incorporated into boron-containing layer (e.g., to form boron oxynitride from a boron nitride target).

In some embodiments of any of the embodiments described herein relating to sputtering boron, a thickness of the boron-containing layer is in a range of from 1 to 35 nm (optionally from 2 to 35 nm). In some such embodiments, the thickness of the deposited layer is in the range of from 1 to 20 nm (optionally from 2 to 20 nm). In some such embodiments, the thickness of the deposited layer is in the range of from 1 to 10 nm (optionally from 2 to 10 nm).

Thickness of a boron-containing layer according to any of the respective embodiments described herein may optionally be controlled, for example, by subjecting the substrate to boron sputtering for a suitable time and/or by bombarding the sputtering target with a suitable flux of energetic particles.

In some embodiments of any of the embodiments described herein relating to sputtering boron, a thickness of the boron-containing layer is selected such that the boron-containing layer contains an amount of boron (per surface area) which is suitable for providing a desired concentration of boron in a p$^+$ layer (according to any of the respective embodiments described herein) after effecting diffusion of boron (according to any of the respective embodiments described herein).

For any given composition of the boron-containing layer (which may be controlled, for example, by selecting a suitable target for sputtering), a thickness (of the boron-containing layer) may readily be selected which provides a desired boron concentration.

In some embodiments of any of the embodiments described herein relating to sputtering boron, a thickness of the boron-containing layer is selected such that the boron-containing layer contains an amount of boron (per surface area) which is suitable for providing a layer of SiB (e.g., a passivating layer) in addition to a desired concentration of boron in a p$^+$ layer (according to any of the respective embodiments described herein), after effecting diffusion of boron (according to any of the respective embodiments described herein). Providing the additional amount of boron in the boron-containing layer which is for providing the SiB layer (in addition to the boron in the p$^+$ layer) may optionally be effected by depositing a boron-containing layer having an additional thickness (optionally no more than 15 nm, and optionally no more than 5 nm). In some such embodiments, the thickness of the deposited layer is in the range of from 1.5 to 15 nm.

Herein, the term "SiB" refers to a combination of silicon and boron atoms, wherein a concentration of the boron atoms exceeds the solubility of boron atoms in at diffusion temperature (up to about 1100° C.), e.g., above about $5 \cdot 10^{20}$ atoms/cm$^3$. The term "SiB" is not intended to imply a 1:1 stoichiometry of Si to B.

SiB may optionally be identified as a substance in which an absolute concentration of boron atoms (e.g., as determined by secondary ion mass spectrometry (SIMS)) is significantly greater than a concentration of electrically active (i.e., dissolved) boron atoms (e.g., as determined by electrochemical capacitance-voltage profiling (ECV)).

In some embodiments of any of the embodiments described herein relating to boron ion implantation, a solid boron-containing layer is a portion of the semiconductor substrate (e.g., silicon) with implanted boron (e.g., the boron-containing layer is formed from a portion of the substrate via implantation of boron ions therein).

Any suitable technique known in the art for implanting boron into a surface may optionally be used.

For example, the boron ions may optionally have an energy in a range of from 3 to 50 keV (optionally 5 to 50 keV).

In some embodiments of any of the embodiments described herein relating to boron ion implantation, the implantation dose is in a range of from $10^{14}$ to $10^{16}$ atoms per cm$^2$.

In some embodiments of any of the embodiments described herein, forming a boron-containing layer is effected such that a thickness of the boron-containing layer and/or concentration of boron in the layer is greater in selected regions of the second surface, the selected regions being intended for being under electrical contacts (which are optionally applied as described herein).

In some embodiments of any of the embodiments described herein, forming a boron-containing layer is effected such that a variability in an amount of boron (optionally in units of atoms per unit area) in the boron-containing layer is no more than ±5%. In some embodiments, the variability of the amount of boron in the boron-containing layer is no more than ±4%. In some embodiments, the variability of the amount of boron in the boron-containing layer is no more than ±3%. In some embodiments, the variability of the amount of boron in the boron-containing layer is no more than ±2%. In some embodiments, the variability of the amount of boron in the boron-containing layer is no more than & 1%.

Variability in an amount of boron may be determined by any suitable technique (e.g., at a resolution in a range of from 0.1 mm to 1 mm), optionally by determining a thickness of the boron-containing layer and assuming that the variability in thickness equals the variability in amount of boron.

In some embodiments of any of the embodiments described herein, forming a boron-containing layer is effected such that a variability in a thickness of the boron-containing layer is no more than ± 5%. In some embodiments, the variability of the thickness of the boron-containing layer is no more than ± 4%. In some embodiments, the variability of the thickness of the boron-containing layer is no more than ±3%. In some embodiments, the variability of the thickness of the boron-containing layer is no more than ±2%. In some embodiments, the variability of the thickness of the boron-containing layer is no more than ± 1%.

Herein throughout, the "variability" of an amount of boron (e.g., boron concentration or amount of boron per unit area) and/or thickness of a boron-containing layer refers to variability throughout regions intended to have the same amount of boron and/or thickness, that is, the presence of regions which deliberately have a different amount of boron (e.g., gaps devoid of boron and/or regions under electric contacts having a higher boron-concentration), according to any of the embodiments described herein, do not per se increase variability of an amount of boron.

Selected regions having a greater amount of boron in the boron-containing layer may optionally be formed by selective formation of a boron-containing layer in such regions alone (e.g., by performing boron sputtering and/or boron ion implantation using a suitable mask), in addition to (prior to and/or subsequent to) forming a boron-containing layer throughout the bulk of the second surface.

It is to be appreciated that selected regions having a greater amount of boron (e.g., formed by selective formation of a boron-containing layer in such regions alone) are not to be considered as part of a boron-containing layer when determining a variability of an amount of boron in a boron-containing layer.

Cap Layer:

In some embodiments of any of the embodiments described herein, the method further comprising forming a cap layer above a boron-containing layer (according to any of the respective embodiments described herein), optionally immediately after forming the boron-containing layer. In some embodiments, a thickness of the cap layer is in a range of from 5 to 30 nm (optionally from 5 to 20 nm).

Herein, the terms "cap" and "capping" refer to a layer being above ("capping") a boron-containing layer (i.e., farther from the substrate than the boron-containing layer), and are not intended to be further limiting.

In some embodiments of any of the embodiments described herein, forming an n-dopant-containing layer (step (a)) is effected subsequent to both forming a boron-containing layer (step (b)) and forming a cap layer.

In some embodiments of any of the embodiments described herein, forming an n-dopant-containing layer (step (a)) is effected subsequent to forming a boron-containing layer (step (b)) and prior to forming a cap layer.

In some embodiments of any of the embodiments described herein, forming an n-dopant-containing layer (step (a)) is effected prior to both forming a boron-containing layer (step (b)) and forming a cap layer.

The cap layer may be formed according to any suitable technique known in the art for forming a cap layer according to any of the respective embodiments described herein. Examples of suitable techniques include, without limitation, sputtering (e.g., ion sputtering and/or radio frequency sputtering), physical vapor deposition and chemical vapor deposition.

In some embodiments according to any of the embodiments, the cap layer comprises an inert substance. In some embodiments, forming the cap layer is effected by deposition of a layer of the inert substance, optionally by sputtering (e.g., ion-beam sputtering and/or radio frequency sputtering).

Examples of inert substances suitable for forming a cap layer include, without limitation, silicon nitride, silicon oxynitride and silicon oxide.

In some embodiments of any of the embodiments described herein, forming a cap layer above the boron-containing layer is effected prior to effecting diffusion (e.g., by thermal treatment). In some embodiments, forming the cap layer above the boron-containing layer is effected prior to deposition of phosphorus-containing (n-dopant-containing) layer. In some such embodiments, the cap layer protects the boron-containing layer (e.g., until diffusion is effected).

In some embodiments according to any of the embodiments described herein, the cap layer is selected such that it reduces an amount of boron removed from the second surface by texturizing (according to any of the respective embodiments described herein), for example, wherein texturizing of the first surface is associated with a small degree of etching of the second surface. In some such embodiments, the cap layer is selected such that it reduces an amount of boron removed from the second surface by texturizing by at least 10% (i.e., in comparison to an amount of boron removed by texturizing, under the same conditions, a corresponding boron-doped substrate lacking the cap layer). In some embodiments, the cap layer is selected such that it reduces an amount of boron removed from the second surface by texturizing by at least 20%. In some embodiments, the cap layer is selected such that it reduces an amount of boron removed from the second surface by texturizing by at least 30%. In some embodiments, the cap layer is selected such that it reduces an amount of boron removed from the second surface by texturizing by at least 40%. In some embodiments, the cap layer is selected such that it reduces an amount of boron removed from the second surface by texturizing by at least 50%. In some embodiments, the cap layer is selected such that it reduces an amount of boron removed from the second surface by texturizing by at least 60%. In some embodiments, the cap layer is selected such that it reduces an amount of boron removed from the second surface by texturizing by at least 70%. In some embodiments, the cap layer is selected such that it reduces an amount of boron removed from the second surface by texturizing by at least 80%. In some embodiments, the cap layer is selected such that it reduces an amount of boron removed from the second surface by texturizing by at least 90%. In some embodiments, the cap layer is selected such that it reduces an amount of boron removed from the second surface by texturizing by at least 95%. In some embodiments, the cap layer is selected such that it reduces an amount of boron removed from the second surface by texturizing by at least 98%. In some embodiments, the cap layer is selected such that it reduces an amount of boron removed from the second surface by texturizing by at least 99%. In some embodiments, the cap layer is selected such that it reduces an amount of boron removed from the second surface by texturizing by at least 99.5%. In some embodiments, the cap layer is selected such that it reduces an amount of boron removed from the second surface by texturizing by at least 99.8%. In some embodiments, the cap layer is selected such that it reduces an amount of boron removed from the second surface by texturizing by at least 99.9%.

In some embodiments according to any of the embodiments described herein, the cap layer substantially prevents removal of boron from the second surface by texturizing (according to any of the respective embodiments described herein).

In some embodiments according to any of the embodiments described herein, the cap layer is selected such that no more than 10% of boron in the second surface is removed by the texturizing. In some such embodiments, the cap layer is selected such that no more than 5% of boron in the second surface is removed by the texturizing. In some such embodiments, the cap layer is selected such that no more than 3% of boron in the second surface is removed by the texturizing. In some such embodiments, the cap layer is selected such that no more than 2% of boron in the second surface is removed by the texturizing. In some such embodiments, the cap layer is selected such that no more than 1% of boron in the second surface is removed by the texturizing. In some such embodiments, the cap layer is selected such that no more than 0.5% of boron in the second surface is removed by the texturizing. In some such embodiments, the cap layer is selected such that no more than 0.3% of boron in the second surface is removed by the texturizing. In some such embodiments, the cap layer is selected such that no more than 0.2% of boron in the second surface is removed by the texturizing. In some such embodiments, the cap layer is selected such that no more than 0.1% of boron in the second surface is removed by the texturizing. In some such embodiments, the cap layer is selected such that no more than 0.05% of boron in the second surface is removed by the texturizing. In some such embodiments, the cap layer is selected such that no more than 0.03% of boron in the second surface is removed by the texturizing. In some such embodiments, the cap layer is selected such that no more than 0.02% of boron in the second surface is removed by the texturizing. In some such embodiments, the cap layer is selected such that no more than 0.01% of boron in the second surface is removed by the texturizing.

Without being bound by any particular theory, it is believed that substrate surfaces heavily doped (e.g., over-doped) with boron are not only relatively resistant to texturization processes, but modest removal of boron upon texturization also has relatively little effect on the properties of heavily boron-doped surfaces, whereas surfaces with relatively low boron concentrations (e.g., no more than $3 \cdot 10^{20}$ atoms per cm$^3$, according to any of the respective embodiments described herein) would be more adversely effected by boron removal upon texturization (e.g., if not reduced by a cap layer).

In some embodiments of any of the embodiments described herein relating to selection of a cap layer having certain properties (according to any of the respective embodiments described herein), selection may optionally be by effecting formation of a cap layer having a thickness sufficient to result in the indicated properties, for example, a thickness of at least 5 nm (optionally up to 30 nm, according to any of the respective embodiments described herein). Alternatively or additionally, selection may optionally be effected by comparing results of different cap layer compositions (e.g., silicon nitride, silicon oxide and/or silicon oxynitride) and/or different methodologies of cap layer formation (according to any of the respective embodiments described herein).

In some embodiments of any of the embodiments described herein, the method further comprises removing a cap layer according to any of the respective embodiments described herein subsequently to removal of an n-doped layer by texturizing (according to any of the respective embodiments described herein), optionally prior to forming a passivating and/or antireflective coating according to any of the respective embodiments described herein. In some such embodiments, the cap layer protects the boron-doped layer from the texturizing process.

In some embodiments according to any of the embodiments described herein, the cap layer is selected such that it reduces a degree of oxidation (e.g., upon exposure to air) of a boron-containing layer (according to any of the respective embodiments described herein) under the cap layer (i.e., in comparison to a degree of oxidation of a corresponding boron-containing layer, under the same conditions, in the absence of the cap layer). In some such embodiments, the cap layer is selected such that it reduces a degree of oxidation of the boron-containing layer by at least 10%. In some embodiments, the cap layer is selected such that it reduces a degree of oxidation of the boron-containing layer by at least 20%. In some embodiments, the cap layer is selected such that it reduces a degree of oxidation of the boron-containing layer by at least 30%. In some embodiments, the cap layer is selected such that it reduces a degree of oxidation of the boron-containing layer by at least 40%. In some embodiments, the cap layer is selected such that it reduces a degree of oxidation of the boron-containing layer by at least 50%. In some embodiments, the cap layer is selected such that it reduces a degree of oxidation of the boron-containing layer by at least 60%. In some embodiments, the cap layer is selected such that it reduces a degree of oxidation of the boron-containing layer by at least 70%. In some embodiments, the cap layer is selected such that it reduces a degree of oxidation of the boron-containing layer by at least 80%. In some embodiments, the cap layer is selected such that it reduces a degree of oxidation of the boron-containing layer by at least 90%.

A degree of oxidation (e.g., upon exposure to air) may optionally be determined as a concentration of oxygen atoms in the boron-containing layer (e.g., oxygen atoms attached to boron atoms). A degree of oxidation may optionally be determined at a pre-determined time after formation of the boron-containing layer and/or cap layer (e.g., 1 hour or 24 hours after cap layer formation).

Without being bound by any particular theory, it is believed that boron-containing layers suitable for doping a substrate with relatively low boron concentrations (e.g., no more than 3.10 atoms per cm$^3$, according to any of the respective embodiments described herein), especially very thin boron-containing layers (e.g., 1 to 35 nm thick, according to any of the respective embodiments described herein) may be relatively sensitive to reactions with the surrounding atmosphere (e.g., oxidation). It is further believed that protection of the boron-containing layer by the cap layer against the atmosphere may enhance reproducibility of the boron-doping.

In some embodiments according to any of the embodiments described herein, the cap layer is selected such that it reduces an amount of boron which escapes into the surrounding atmosphere upon effecting diffusion of boron according to any of the respective embodiments described herein (i.e., in comparison to an amount of boron which escapes into the surrounding atmosphere, under the same conditions, in the absence of the cap layer). In some such embodiments, the cap layer is selected such that it reduces an amount of boron which escapes into the surrounding atmosphere by at least 10%. In some embodiments, the cap layer is selected such that it reduces an amount of boron which escapes into the surrounding atmosphere by at least 20%. In some embodiments, the cap layer is selected such that it reduces an amount of boron which escapes into the surrounding atmosphere by at least 30%. In some embodiments, the cap layer is selected such that it reduces an amount of boron which escapes into the surrounding atmosphere by at least 40%. In some embodiments, the cap layer is selected such that it reduces an amount of boron which escapes into the surrounding atmosphere by at least 50%. In some embodiments, the cap layer is selected such that it reduces an amount of boron which escapes into the surrounding atmosphere by at least 60%. In some embodiments, the cap layer is selected such that it reduces an amount of boron which escapes into the surrounding atmosphere by at least 70%. In some embodiments, the cap layer is selected such that it reduces an amount of boron which escapes into the surrounding atmosphere by at least 80%. In some embodiments, the cap layer is selected such that it reduces an amount of boron which escapes into the surrounding atmosphere by at least 90%. In some embodiments, the cap layer is selected such that it reduces an amount of boron which escapes into the surrounding atmosphere by at least 95%. In some embodiments, the cap layer is selected such that it reduces an amount of boron which escapes into the surrounding atmosphere by at least 98%. In some embodiments, the cap layer is selected such that it reduces an amount of boron which escapes into the surrounding atmosphere by at least 99%. In some embodiments, the cap layer is selected such that it reduces an amount of boron which escapes into the surrounding atmosphere by at least 99.5%. In some embodiments, the cap layer is selected such that it reduces an amount of boron which escapes into the surrounding atmosphere by at least 99.8%. In some embodiments, the cap layer is selected such that it reduces an amount of boron which escapes into the surrounding atmosphere by at least 99.9%.

In some embodiments according to any of the embodiments described herein, the cap layer is selected such that no more than 50% of boron in the boron-containing layer (according to any of the respective embodiments described herein) escapes into the surrounding atmosphere upon effecting diffusion of said boron (according to any of the respective embodiments described herein). In some such embodiments, the cap layer is selected such that no more than 30% of boron in the boron-containing layer escapes into the surrounding atmosphere upon effecting the diffusion of said boron. In some embodiments, the cap layer is selected such that no more than 20% of boron in the boron-containing layer escapes into the surrounding atmosphere upon effecting the diffusion of said boron. In some embodiments, the cap layer is selected such that no more than 10% of boron in the boron-containing layer escapes into the surrounding atmosphere upon effecting the diffusion of said boron. In some embodiments, the cap layer is selected such that no more than 5% of boron in the boron-containing layer escapes into the surrounding atmosphere upon effecting the diffusion of said boron. In some embodiments, the cap layer is selected such that no more than 3% of boron in the boron-containing layer escapes into the surrounding atmosphere upon effecting the diffusion of said boron. In some embodiments, the cap layer is selected such that no more than 2% of boron in the boron-containing layer escapes into the surrounding atmosphere upon effecting the diffusion of said boron. In some embodiments, the cap layer is selected such that no more than 1% of boron in the boron-containing layer escapes into the surrounding atmosphere upon effecting the diffusion of said boron. In some embodiments, the cap layer is selected such that no more than 0.5% of boron in the boron-containing layer escapes into the surrounding atmosphere upon effecting the diffusion of said boron. In some embodiments, the cap layer is selected such that no more than 0.3% of boron in the boron-containing layer escapes into the surrounding atmosphere upon effecting the diffusion of said boron. In some embodiments, the cap layer is selected such that no more than 0.2% of boron in the boron-containing layer escapes into the surrounding atmosphere upon effecting the diffusion of said boron. In some embodiments, the cap layer is selected such that no more than 0.1% of boron in the boron-containing layer escapes into the surrounding atmosphere upon effecting the diffusion of said boron. In some embodiments, the cap layer is selected such that no more than 0.05% of boron in the boron-containing layer escapes into the surrounding atmosphere upon effecting the diffusion of said boron. In some embodiments, the cap layer is selected such that no more than 0.03% of boron in the boron-containing layer escapes into the surrounding atmosphere upon effecting the diffusion of said boron. In some embodiments, the cap layer is selected such that no more than 0.02% of boron in the boron-containing layer escapes into the surrounding atmosphere upon effecting the diffusion of said boron. In some embodiments, the cap layer is selected such that no more than 0.01% of boron in the boron-containing layer escapes into the surrounding atmosphere upon effecting the diffusion of said boron.

Without being bound by any particular theory, it is believed that escape of boron from a boron-containing layer during diffusion (e.g., diffusion effected by heating, according to any of the respective embodiments described herein) can deleteriously result in heterogeneous boron-doping, for example, in reduced boron-doping along the edge of a substrate surface (relative to boron-doping in the center of the substrate surface) due to a greater degree of boron escaping from the edge of the substrate (particularly if multiple substrates are subjected to diffusion in a stack).

In some embodiments according to any of the embodiments described herein, the cap layer is selected such that it reduces an amount of boron which diffuses into the first surface of the substrate upon effecting diffusion of boron according to any of the respective embodiments described herein (i.e., in comparison to an amount of boron which diffuses into the first surface, under the same conditions, in the absence of the cap layer). In some such embodiments, the cap layer is selected such that it reduces an amount of boron which diffuses into the first surface by at least 10%. In some embodiments, the cap layer is selected such that it reduces an amount of boron which diffuses into the first surface by at least 20%. In some embodiments, the cap layer is selected such that it reduces an amount of boron diffuses into the first surface by at least 30%. In some embodiments, the cap layer is selected such that it reduces an amount of boron which diffuses into the first surface by at least 40%. In some embodiments, the cap layer is selected such that it reduces an amount of boron which diffuses into the first surface by at least 50%. In some embodiments, the cap layer is selected such that it reduces an amount of boron which diffuses into the first surface by at least 60%. In some embodiments, the cap layer is selected such that it reduces an amount of boron which diffuses into the first surface by at least 70%. In some embodiments, the cap layer is selected such that it reduces an amount of boron which diffuses into the first surface by at least 80%. In some embodiments, the cap layer is selected such that it reduces an amount of boron which diffuses into the first surface by at least 90%. In some embodiments, the cap layer is selected such that it reduces an amount of boron which diffuses into the first surface by at least 95%. In some embodiments, the cap layer is selected such that it reduces an amount of boron which diffuses into the first surface by at least 98%. In some embodiments, the cap layer is selected such that it reduces an amount of boron which diffuses into the first surface by at least 99%.

Without being bound by any particular theory, it is believed that escape of boron from a boron-containing layer during diffusion (e.g., diffusion effected by heating, according to any of the respective embodiments described herein) can deleteriously result in gaseous boron diffusing into the first surface (which is intended to be doped by the n-dopant), especially in embodiments which do not include removal of a first n-doped layer.

In some embodiments according to any of the embodiments described herein relating to boron escape and/or diffusion into a first surface upon effecting diffusion of boron, the diffusion of boron is effected by exposure to an elevated temperature, for example, in a range of from 950° C. to 1050° C. (e.g., according to any of the respective embodiments described herein).

In some embodiments according to any of the embodiments described herein, forming each of the boron-containing layer and cap layer above the boron-containing layer (on the second surface of the substrate) is effected prior to forming the n-dopant-containing layer (on the first surface of the substrate). In some such embodiments, the cap layer (which is formed prior to the n-dopant-containing layer) is selected such that it reduces an amount of n-dopant (e.g., phosphorus) which diffuses into the second surface of the substrate upon effecting diffusion of the n-dopant and boron according to any of the respective embodiments described herein (i.e., in comparison to an amount of n-dopant which diffuses into the second surface, under the same conditions, in the absence of the cap layer). In some such embodiments, the cap layer is selected such that it reduces an amount of n-dopant which diffuses into the second surface by at least 10%. In some embodiments, the cap layer is selected such that it reduces an amount of n-dopant which diffuses into the second surface by at least 20%. In some embodiments, the cap layer is selected such that it reduces an amount of n-dopant which diffuses into the second surface by at least 30%. In some embodiments, the cap layer is selected such that it reduces an amount of n-dopant which diffuses into the second surface by at least 40%. In some embodiments, the cap layer is selected such that it reduces an amount of n-dopant which diffuses into the second surface by at least 50%. In some embodiments, the cap layer is selected such that it reduces an amount of n-dopant which diffuses into the second surface by at least 60%. In some embodiments, the cap layer is selected such that it reduces an amount of n-dopant which diffuses into the second surface by at least 70%. In some embodiments, the cap layer is selected such that it reduces an amount of n-dopant which diffuses into the second surface by at least 80%. In some embodiments, the cap layer is selected such that it reduces an amount of n-dopant which diffuses into the second surface by at least 90%. In some embodiments, the cap layer is selected such that it reduces an amount of n-dopant which diffuses into the second surface by at least 95%. In some embodiments, the cap layer is selected such that it reduces an amount of n-dopant which diffuses into the second surface by at least 98%. In some embodiments, the cap layer is selected such that it reduces an amount of n-dopant which diffuses into the second surface by at least 99%. In some embodiments, the cap layer is selected such that it reduces an amount of n-dopant which diffuses into the second surface by at least 99.5%. In some embodiments, the cap layer is selected such that it reduces an amount of n-dopant which diffuses into the second surface by at least 99.8%. In some embodiments, the cap layer is selected such that it reduces an amount of n-dopant which diffuses into the second surface by at least 99.9%.

Without being bound by any particular theory, it is believed that a cap layer formed (on the second surface) prior to an n-dopant-containing layer may serve as a barrier to n-dopant inadvertently contacting and/or diffusing into the second surface (which is intended to be doped by boron).

In some embodiments according to any of the embodiments described herein, the cap layer is formed such that a border of the cap layer corresponds to a desired border of an n-doped layer (according to any of the respective embodiments described herein). The cap layer may optionally determine the border of an n-doped layer by preventing n-doping across the border (i.e., in a region covered by the cap layer), for example, facilitating separation (i.e., reducing overlap) of an n-doped layer and a boron-doped layer, which can enhance shunt resistance.

In some embodiments according to any of the embodiments described herein, forming the cap layer is effected such that the cap layer covers an edge of the substrate (i.e., a surface between the first surface and the second surface, which is optionally perpendicular to each of the first surface and second surface), and optionally covers all of the edges of the substrate. In some such embodiments, the cap layer prevents formation of an n-doped layer (according to any of the respective embodiments described herein) on an edge of the substrate.

It is to be understood that, unless otherwise defined, the operations described herein can be executed in many combinations or orders of execution. The ordering described herein is not to be considered as limiting. For example, two or more operations, appearing in the description in a particular order, can be executed in a different order (e.g., a reverse order) or substantially contemporaneously.

The Photovoltaic Cell:

According to an aspect of some embodiments of any of the embodiments described herein, there is provided a bifacial photovoltaic cell prepared by a method described herein in any one of the respective embodiments and any combination thereof.

According to an aspect of some embodiments of any of the embodiments described herein, there is provided a bifacial photovoltaic cell comprising a semiconductor substrate (e.g., silicon), the substrate comprising an $n^+$ layer on a first surface thereof and a $p^+$ layer on a second surface thereof, the $n^+$ layer comprising an n-dopant (e.g., phosphorus) and the $p^+$ layer comprising boron. Preferably, the photovoltaic cell further comprises electrical contacts on each of said first surface and said second surface, which are suitable for a bifacial cell (e.g., the contacts do not cover a large proportion of either surface). In some embodiments, the cell is prepared by a method as described herein.

In some embodiments of any of the embodiments described herein for a photovoltaic cell, a variability of boron concentration in a $p^+$ layer is no more than ±5%. In some embodiments, the variability of boron concentration in the $p^+$ layer is no more than ±4%. In some embodiments, the variability of boron concentration in the $p^+$ layer is no more than ±3%. In some embodiments, the variability of boron concentration in the $p^+$ layer is no more than ±2%. In some embodiments, the variability of boron concentration in the $p^+$ layer is no more than ±1%.

Variability in boron concentration may be determined by any suitable technique (e.g., at a resolution in a range of from 0.1 mm to 1 mm), optionally by determining a sheet resistance of a given portion of the p$^+$ layer (e.g., a square of from 0.1 to 1 mm) and assuming that variability in sheet resistance (at low values such as 5% of less) is equivalent to variability in boron concentration.

In some embodiments of any of the embodiments described herein, a concentration of boron in a p$^+$ layer is less than $10^{21}$ atoms/cm$^3$, optionally less than $3·10^{20}$ atoms/cm$^3$, optionally less than $10^{20}$ atoms/cm$^3$, optionally less than $3·10^{19}$ atoms/cm$^3$ and optionally less than $10^{19}$ atoms/cm$^3$.

In some embodiments of any of the embodiments described herein, the p$^+$ layer is characterized by a sheet resistance according to any of the respective embodiments described herein, e.g., in a range of from 15 to 300 ohms, from 30 to 300 ohms, from 30 to 200 ohms and/or from 30 to 150 ohms.

In some embodiments of any of the embodiments described herein, the first surface is texturized.

In some embodiments of any of the embodiments described herein, the second surface is texturized. Optionally the first and second surfaces are both texturized.

In some embodiments of any of the embodiments described herein, the photovoltaic cell further comprises a passivating and/or antireflective coating (according to any of the embodiments described herein) on at least a portion of the second surface, optionally the entire second surface. In some embodiments, the passivating and/or antireflective coating covers at least a portion of, and optionally all of, the edges of the substrate; and optionally covers a portion of the first surface bordering an edge of the substrate (e.g., an area of the first surface having a width of up to 0.5 mm, optionally from 0.1-0.5 mm, bordering the edge).

In some embodiments of any of the embodiments described herein, the photovoltaic cell further comprising a passivating and/or antireflective coating (according to any of the embodiments described herein) on at least a portion of the first surface, optionally the entire first surface. In some embodiments, a passivating and/or antireflective coating covers at least a portion of each of the first surface and the second surface, and optionally the entire first surface and second surface. A passivating and/or antireflective coating on the first surface may be the same as, or different than a passivating and/or antireflective coating on the second surface.

In some embodiments, a total thickness of passivating coating(s) (according to any of the embodiments described herein) is in a range of from 1 to 15 nm, optionally in a range of from 2 to 15 nm, and optionally in a range of from 5 to 15 nm.

Examples of passivating and/or antireflective coatings according to any of the respective embodiments described herein include, without limitation, coatings comprising silicon nitride, silicon oxynitride. $TiO_2$, $ZrO_2$, and/or $Ta_2O_5$. When more than one layer is present in a passivating and/or antireflective coating, the different layers may differ, for example, in refractive index (e.g., an upper layer having a lower refractive index than a lower layer) and/or components (e.g., one layer comprising silicon oxynitride and another layer comprising silicon nitride).

In some embodiments of any of the embodiments described herein, an n$^+$ layer of the photovoltaic cell (optionally a second n$^+$ layer prepared according to any of the respective embodiments described herein, or a first n$^+$ layer prepared according to any of the respective embodiments described herein which do not include preparing a second n$^+$ layer) is characterized by a sheet resistance in a range of from 70 to 150 ohms.

In some embodiments of any of the embodiments described herein, a concentration of boron in a p$^+$ layer (according to any of the respective embodiments described herein) is greater in regions underlying said electrical contacts on said second surface. In some embodiments, a concentration of boron in regions underlying said electrical contacts is at least 20% greater than a concentration of boron in the rest of the p$^+$ layer. In some embodiments, a concentration of boron in regions underlying said electrical contacts is at least 40% greater than a concentration of boron in the rest of the p$^+$ layer. In some embodiments, a concentration of boron in regions underlying said electrical contacts is at least 60% greater than a concentration of boron in the rest of the p$^+$ layer. In some embodiments, a concentration of boron in regions underlying said electrical contacts is at least 80% greater than a concentration of boron in the rest of the p$^+$ layer. In some embodiments, a concentration of boron in regions underlying said electrical contacts is at least 100% greater than (twice) a concentration of boron in the rest of the p$^4$ layer. In some embodiments, a concentration of boron in regions underlying said electrical contacts is at least 200% greater than (3-fold) a concentration of boron in the rest of the p$^+$ layer. In some embodiments, a concentration of boron in regions underlying said electrical contacts is at least 400% greater than (5-fold) a concentration of boron in the rest of the p$^+$ layer. In some embodiments, a concentration of boron in regions underlying said electrical contacts is at least 900% greater than (10-fold) a concentration of boron in the rest of the p$^+$ layer.

In some embodiments of any of the embodiments described herein, the photovoltaic cell further comprises a SiB layer on the second surface, optionally a SiB layer prepared according to any of the respective embodiments described herein. The SiB layer may optionally be a passivating coating according to any of the respective embodiments described herein.

In some embodiments of any of the embodiments described herein, the second surface of the photovoltaic cell comprises from $10^{14}$ to $10^{16}$ boron atoms per cm$^2$. In some embodiments, the second surface comprises from $3·10^{14}$ to $3·10^5$ boron atoms per cm$^2$.

In some embodiments of any of the embodiments described herein, a maximal concentration of boron in said second surface is less than $3·10^{20}$ atoms/cm$^3$. In some embodiments, the concentration of boron is less than $10^{20}$ atoms/cm$^3$. In some embodiments, the concentration of boron is less than $3·10^{19}$ atoms/cm$^3$. In some embodiments, the concentration of boron is less than $10^{19}$ atoms/cm$^3$.

In some embodiments of any of the embodiments described herein, a p$^+$ layer (according to any of the respective embodiments described herein) is characterized by a sheet resistance of at least 15 ohms/o. In some embodiments, the sheet resistance of a p$^+$ layer is in a range of from 15 to 300 ohms/o. In some embodiments, the sheet resistance of a p$^+$ layer is in a range of from 15 to 200 ohms/n. In some embodiments, the sheet resistance of a p$^+$ layer is in a range of from 15 to 150 ohms/o.

In some embodiments of any of the embodiments described herein, a p$^+$ layer (according to any of the respective embodiments described herein) is characterized by a sheet resistance of at least 30 ohms/o. In some embodiments, the sheet resistance of a p$^+$ layer is in a range of from 30 to 300 ohms/o. In some embodiments, the sheet resistance of a p$^+$ layer is in a range of from 30 to 200 ohms/o. In some embodiments, the sheet resistance of a p$^+$ layer is in a range of from 30 to 150 ohms/o.

According to some embodiments, a p$^+$ layer of the photovoltaic cell does not cover an area bordering an edge of the substrate thereof, the area having a width in a range of 0.1-0.5 mm. Such an area may optionally be prepared by masking and/or etching the second surface, according to any of the respective embodiments described herein.

In any of the embodiments described herein (according to any of the aspects described herein), the semiconductor substrate comprises silicon, and optionally consists essentially of doped silicon (e.g., p-type or n-type silicon).

In any of the embodiments described herein (according to any of the aspects described herein), the semiconductor substrate may optionally be an n-type semiconductor (e.g., n-doped silicon), such that the photovoltaic cell has a p$^+$-n-n$^+$ structure; or a p-type semiconductor (e.g., p-doped silicon), such that the photovoltaic cell has a n$^+$-p-p$^+$ structure.

In some embodiments of any of the embodiments described herein, the semiconductor substrate is a p-type semiconductor. In exemplary embodiments, the substrate is p-doped silicon.

In some embodiments of any of the embodiments described herein, an effective back surface recombination of the photovoltaic cell (according to any of the respective embodiments described herein) is less than 150 cm/second. In some embodiments, the effective back surface recombination is less than 100 cm/second. In some embodiments, the effective back surface recombination is less than 60 cm/second. In some embodiments, the effective back surface recombination is less than 30 cm/second. In some embodiments, the effective back surface recombination is less than 20 cm/second. In some embodiments, the effective back surface recombination is less than 10 cm/second. In some embodiments, the effective back surface recombination is less than 5 cm/second.

Effective surface recombination (e.g., of the back surface) may be determined according to any suitable technique known in the art, for example, by measuring spectral internal quantum efficiency upon illumination (e.g., of the back side). Optionally, effective surface recombination is determined as described in Eisenberg et al. [*Energy Procedia* 2016, 92:16-23], the contents of which are incorporated herein by reference (especially contents relating to measurement of surface recombination).

In some embodiments of any of the embodiments described herein, a front side efficiency of the photovoltaic cell (according to any of the respective embodiments described herein) is at least 19%. In some embodiments, the front side efficiency is at least 19.5%. In some embodiments, the front side efficiency is at least 20%. In some embodiments, the front side efficiency is at least 20.5%. In some embodiments, the front side efficiency is at least 21%. In some embodiments, the front side efficiency is at least 21.5%. In some embodiments, the front side efficiency is at least 22%.

Herein, the phrase "front side efficiency" refers to efficiency (as described herein) of the photovoltaic cell under conditions wherein only one (front) side of the cell is exposed to illumination (e.g., wherein the other side is placed on a black opaque surface). The "front side" exposed to illumination is defined as whichever side is characterized by the higher efficiency.

The efficiency of a cell (e.g., with respect to illumination of any given side thereof) may be determined by determining the maximal power output of the cell, and dividing by the input light irradiance, at standard test conditions.

In some embodiments of any of the embodiments described herein, an open circuit voltage of the photovoltaic cell (according to any of the respective embodiments described herein) is at least 620 mV. In some embodiments, the open circuit voltage is at least 630 mV. In some embodiments, the open circuit voltage is at least 640 mV. In some embodiments, the open circuit voltage is at least 650 mV. In some embodiments, the open circuit voltage is at least 660 mV.

Physical parameters described herein relating to photovoltaic cell performance are determined by measurements at standard test conditions used in the art to evaluate photovoltaic cells. Standard test conditions include solar irradiance of 1,000 W/m$^2$, solar reference spectrum at AM (air mass) of 1.5 and a cell temperature 25° C.

In some embodiments of any of the embodiments described herein, a ratio of back side short circuit current to front side short circuit current is at least 0.75. In some embodiments, the ratio of back side short circuit current to front side short circuit current is at least 0.8. In some embodiments, the ratio of back side short circuit current to front side short circuit current is at least 0.85. In some embodiments, the ratio of back side short circuit current to front side short circuit current is at least 0.9.

Herein, the phrase "front side short circuit current" refers to short circuit current (as described herein) of the photovoltaic cell under conditions wherein only the front side of the cell is exposed to illumination (e.g., wherein the back side is placed on a black opaque surface), and the phrase "back side short circuit current" refers to short circuit current (as described herein) of the photovoltaic cell under conditions wherein only the back side of the cell is exposed to illumination (e.g., wherein the front side is placed on a black opaque surface). The "front side" is defined as whichever side is characterized by the higher efficiency and the "back side" is defined as whichever side is characterized by the lower efficiency (determined as described herein).

Short circuit current ($I_{SC}$) may be determined, for example, by measuring the current produced by the photovoltaic cell at short circuit (i.e., voltage=0) using standard techniques of the art.

As the back side is (by definition) less efficient than the front side, a ratio of back side short circuit current to front side short circuit current is typically less than 1, optionally less than 0.95.

Without being bound by an particular theory, it is believed that a relatively high ratio of back side short circuit current to front side short circuit current (e.g., as described herein) is associated with a superior rear side design (e.g., the p$^+$ layer in a p$^+$-p-n$^+$ structure), characterized by a relatively uniform concentration of dopant, reduction and even elimination of over-doping, and/or low effective back side recombination. It is further believed that values of other parameters described herein, such as relatively high front side efficiency, may also be improved by a superior rear side design.

According to some embodiments, the specific shunt resistance of the photovoltaic cell is at least 5.000 ohm*cm$^2$ (i.e., ohm multiplied by cm$^2$), optionally at least 5.500 ohm*cm$^2$, optionally at least 6.000 ohm*cm$^2$, optionally at least 6,500 ohm*cm$^2$, and optionally at least 7,000 ohm*cm$^2$. As specific shunt resistance may depend on the area and shape of a photovoltaic cell, the aforementioned specific shunt resistance may be determined for a photovoltaic cell having an area of about 230 cm$^2$ and being substantially square (i.e., having a circumference of about 61 cm).

In some embodiments, the photovoltaic cell exhibits a specific shunt resistance according to any of the respective embodiments described herein in combination with a relatively low boron concentration (e.g., no more than $10^{20}$ atoms per $cm^3$) according to any of the respective embodiments described herein.

Without being bound by any particular theory, it is believed that known techniques for enhancing shunt resistance (e.g., laser edge isolation) are less effective (and even deleterious) in high-efficiency cells (such as cells with low controlled boron concentrations, as described herein).

According to another aspect of embodiments of the invention, there is provided a photovoltaic module comprising a plurality of any of the photovoltaic cells described herein, the photovoltaic cells being interconnected to one another.

As used herein, the phrase "photovoltaic module" describes a module comprising an array of photovoltaic cells which are interconnected in series and/or in parallel. Connection of the cells in series creates a higher voltage. Connection of the cells in parallel results in a higher current. Thus, a skilled artisan can connect the cells in a manner which will provide a desired voltage and current.

The module may optionally further combine additional elements such as a sheet of glass to protect the photovoltaic cell from the environment without blocking light from reaching the photovoltaic cell and/or a base which orients the module in the direction of a source of light (e.g., for tracking the daily movement of the sun). Optionally, an inverter is present in order to convert the direct current to alternating current. A battery is optionally present in order to store energy generated by the photovoltaic cell.

According to another aspect of embodiments of the present invention, there is provided a power plant comprising the photovoltaic modules described herein. The power plant optionally comprises a plurality of photovoltaic modules positioned so as to maximize their exposure to sunlight.

It is to be appreciated that an optimal position and orientation of a photovoltaic module including the bifacial photovoltaic cells described herein may be different than an optimal position of an array of monofacial photovoltaic cells.

According to another aspect of embodiments of the present invention, there is provided an electric device comprising a photovoltaic cell according to any of the respective embodiments described herein. The electric device may be configured such that both sides of the bifacial photovoltaic cell are exposed to light (e.g., being at a surface of the device). In some embodiments, the photovoltaic cells are a power source for the electric device.

Exemplary applications of the photovoltaic cells and/or photovoltaic modules described herein include, but are not limited to, a home power source, a hot water heater, a pocket computer, a notebook computer, a portable charging dock, a cellular phone, a pager, a PDA, a digital camera, a smoke detector, a GPS device, a toy, a computer peripheral device, a satellite, a space craft, a portable electric appliance (e.g., a portable TV, a portable lighting device), and a cordless electric appliance (e.g., a cordless vacuum cleaner, a cordless drill and a cordless saw).

According to another aspect of embodiments of the present invention, there is provided a detector of electromagnetic radiation, the detector comprising any photovoltaic cell described herein, wherein the electromagnetic radiation is selected from the group consisting of ultraviolet, visible and infrared radiation. The detector may be used, for example, in order to detect the radiation (e.g., as an infrared detector) and/or to measure the amount of radiation (e.g., in spectrophotometry).

It is expected that during the life of a patent maturing from this application many relevant doping techniques (e.g., sputtering and ion implantation techniques) will be developed and the scope of the terms "doping". "sputtering" and "ion implantation" are is intended to include all such new technologies a priori.

As used herein the term "about" refers to ±10%

The terms "comprises". "comprising". "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non-limiting fashion.

Example 1

Controllable Formation of p$^+$-Layers with Different Sheet Resistance Using Sputtered Boron-Containing Solid Diffusion Source Chochralski n-type silicon wafers having a resistivity of approximately 5 Ω·cm were chosen as substrates. Boron-containing surface sources were deposited on the surface of polished silicon substrates by radio frequency (RF) sputtering of a boron nitride (BN) target. Pure argon or argon with addition of oxygen was used as sputtering ions. Depending on concentration of oxygen in the sputtering gas, BN or BO$_x$N$_y$ layers were formed with thicknesses in a range of 1-10 nm.

Thickness uniformity of the layers deposited on a wafer surface was determined along the diagonal of a 6" square wafer, for samples prepared using different discharge powers in the range 1-4 kW, using ellipsometry to determine thickness and refractive index of the deposited layers.

As shown in FIG. 1, the variations in boron-containing layer thickness did not exceed about ±4-5% for any of the tested discharge powers, as determined by ellipsometry.

Boron-containing layers prepared as described hereinabove were protected prior to diffusion processing, by forming SiN and/or SiO$_x$ cap layers of 5 to 20 nm thickness by sputtering. Diffusion in a quartz tube furnace at a temperature of 1025° C. was undertaken with the wafers disposed in a stack, to form a boron-doped p$^+$ layer in the silicon substrate.

Figure 2:
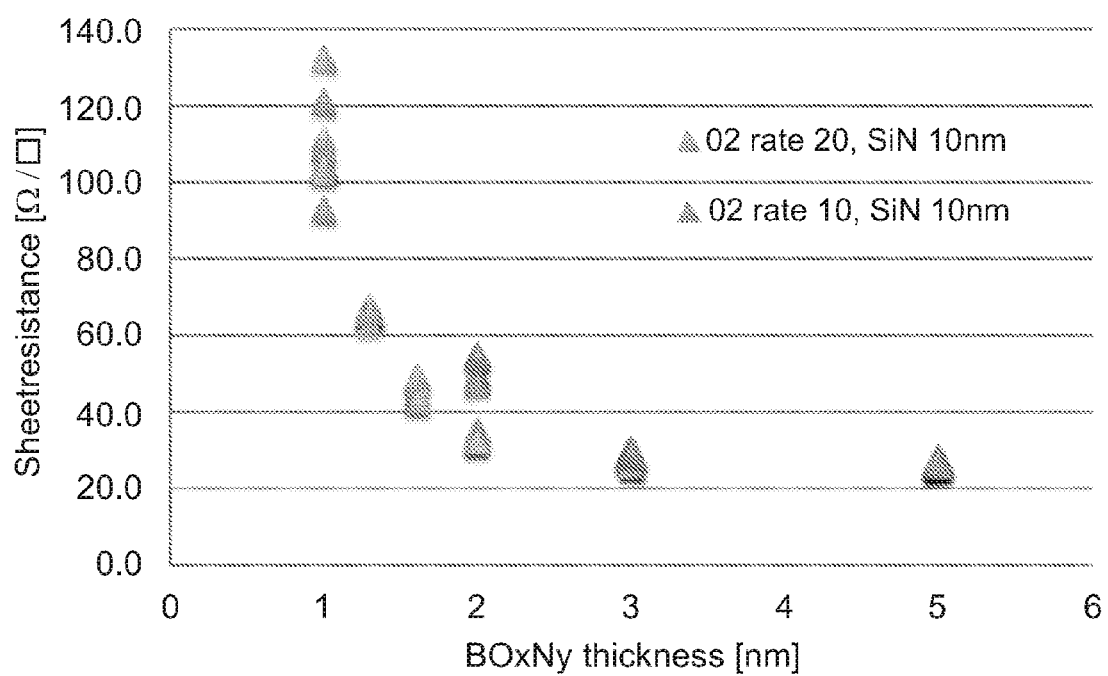
FIG. 2 is a graph showing the sheet resistance of a boron-doped p$^+$ layer as a function of the thickness of a boron-containing layer (BO$_x$N$_y$) deposited by sputtering at an oxygen flow rate of 10 or 20 cm$^3$/minute (discharge power 4 kW) and used to prepare the p$^+$ layer upon capping with a 10 nm layer of SiN and subsequent thermal diffusion, in accordance with some embodiments of the invention.

As shown in FIG. 2, diffusion for 30 minutes following formation of a 10 nm SiN capping layer resulted in boron-doped p$^+$ layers in the silicon characterized by very low scattering of sheet resistance (R$_{sh}$) values for a given thickness of boron-containing layer sputtered on the silicon surface (including sputtering at an oxygen flow rate of 10 or 20 cm$^3$/minute.

This result indicates a high degree of reproducibility. The scattering in R$_{sh}$ values was lower than in samples without a cap layer (data not shown), indicating that the cap layer plays a role in reducing scattering and enhancing reproducibility.

As further shown in FIG. 2, a wide range of specific R$_{sh}$ values (about 20-100 ohms) were obtained for specific boron-containing layer thicknesses in a range of 1-5 nm. This obtained range of sheet resistance values is suitable for solar cell design.

These results indicate that a suitable sheet resistance of a boron-containing layer, depending on the technological requirements of the solar cell, can be obtained by selecting an appropriate thickness of a boron-containing layer, with a high degree of uniformity over a wafer surface.

Example 2

Controllable Formation of p$^+$-Layers with Suppressed Effective Surface Recombination (S$_{eff}$)

n-Type silicon wafers were symmetrically doped to form p$^+$ layers on both sides, using a surface-deposited solid source of boron. Two series of silicon samples were used for comparative analysis of the effect of doping procedures on effective surface recombination of p+ layers.

Both sides of each wafer in the first series were coated by a borosilicate solution using a spin-on technique. A boron-containing film was formed after drying the deposited coating of solution.

Both sides of each wafer in the second series were coated by boron oxynitride films having a thickness of 1 to 3 nm, prepared by radio frequency sputtering, and capped by a sputtered SiN layer having a 10 nm thickness.

All the wafers were subjected to diffusion in stacks in a quartz tube furnace at a temperature of 1025° C. for 30 minutes in a nitrogen atmosphere. The boron concentration at various depths was then determined by secondary ion mass spectrometry (SIMS).

Figure 3:
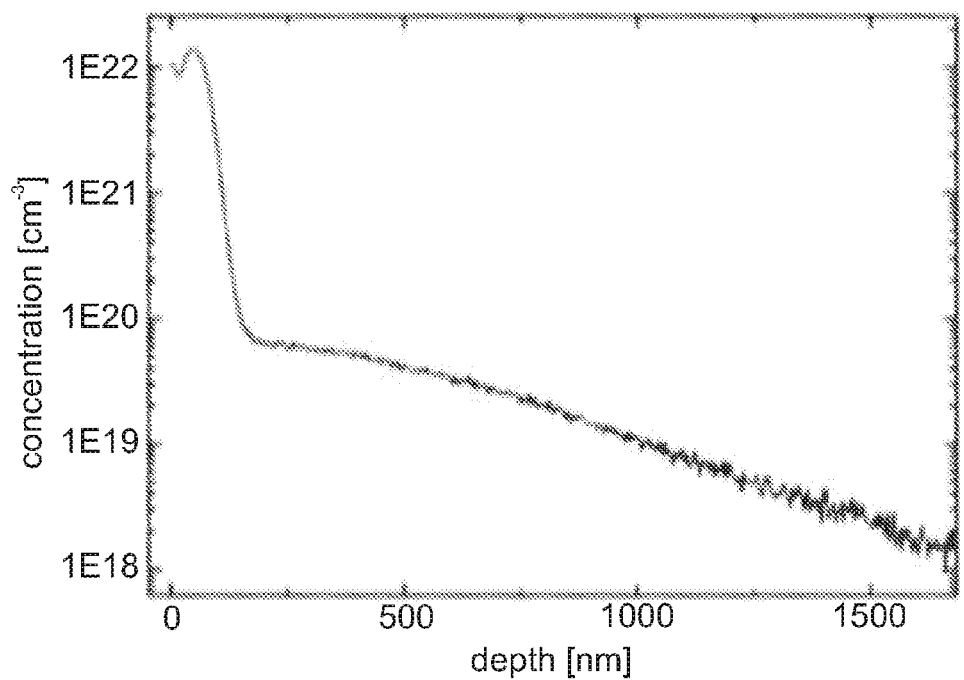
FIG. 3 is a graph showing boron concentration (in atoms/cm$^3$) as a function of distance from the surface of a representative silicon substrate doped by spin-on of a boron source followed by thermal diffusion (as determined by secondary ion mass spectrometry).

As shown in FIG. 3, samples prepared using a spun-on doping source exhibited a surface boron concentration at low depths which exceeded the solubility limit of boron in silicon (approximately 5·10$^{20}$ atoms per cm$^3$) indicating a typical over-doping of silicon by boron.

Figure 4:
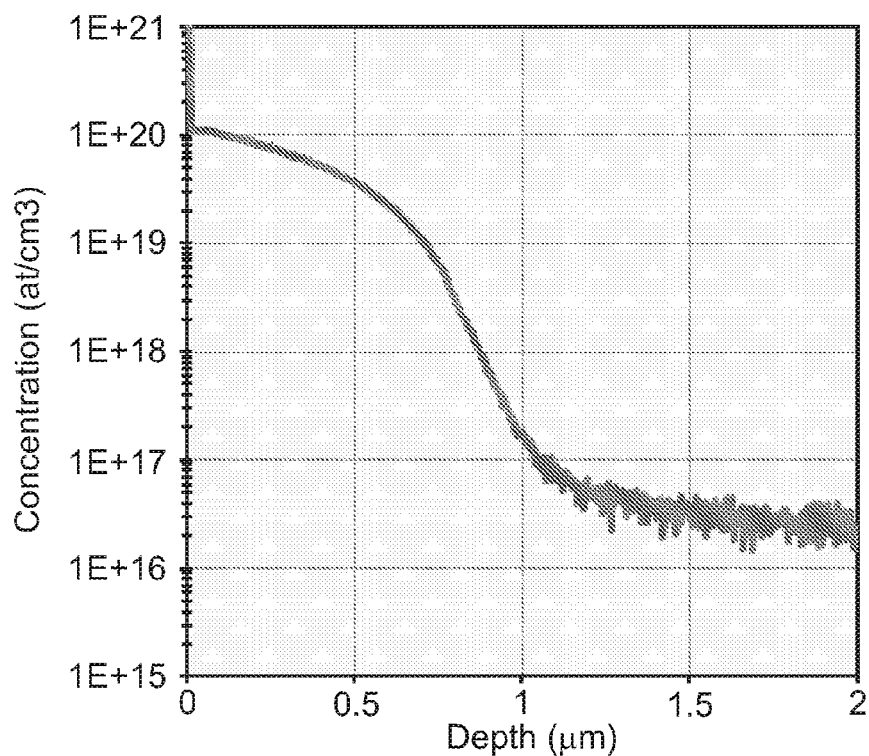
FIG. 4 is a graph showing boron concentration (in atoms/cm$^3$) as a function of distance from the surface of an exemplary silicon substrate doped using radio frequency sputtering of boron followed by thermal diffusion in accordance with some embodiments of the invention (as determined by secondary ion mass spectrometry).

In contrast, as shown in FIG. 4, representative wafers processed using boron sputtering (followed by thermal treatment) exhibited lower surface boron concentrations (no more than 10$^{20}$ atoms/cm$^3$) and greater control over surface boron concentrations (e.g., by remaining consistently below the solubility level of boron).

Figure 5:
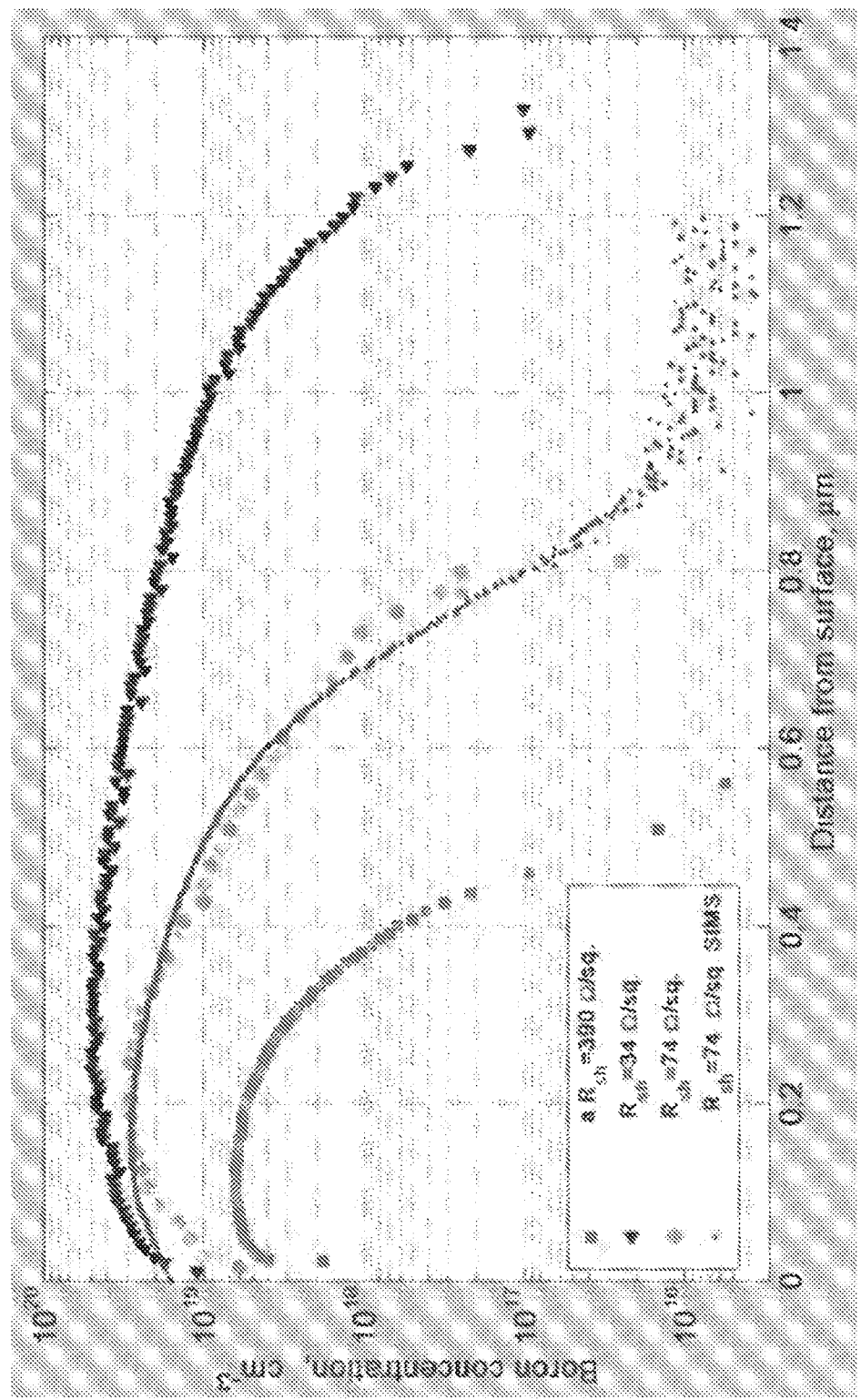
FIG. 5 is a graph showing boron concentration (in atoms/cm$^3$) in boron-doped p$^+$ layers having a sheet resistance of 34, 74 or 390 ohms per square ($\Omega$/sq.), as a function of distance from the surface of exemplary silicon substrates doped using radio frequency sputtering of boron followed by thermal diffusion in accordance with some embodiments of the invention (as determined by electrochemical capacitance-voltage profiling (ECV) or by secondary ion mass spectrometry (SIMS)).
Figure 6:
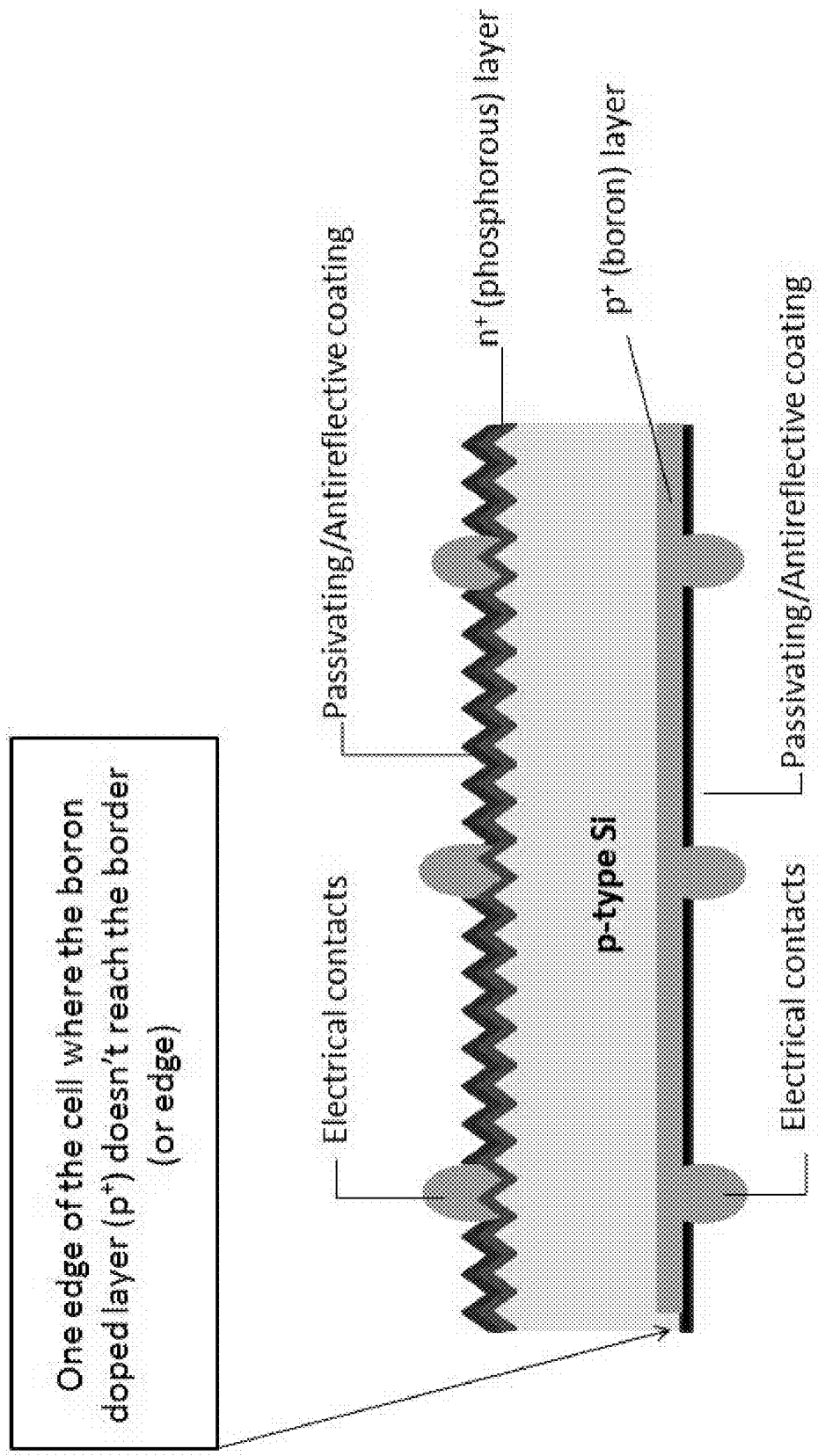
FIG. 6 is a drawing depicting the edge of the second surface which is devoid of an n-dopant.

Similarly, as shown in FIG. 5, additional wafers processed using boron sputtering (followed by thermal treatment and subsequent dry thermal oxidation) and characterized by different surface resistances (34, 74 and 390 ohms per square) exhibited different concentration/depth profiles of boron, each being characterized by low surface boron concentrations (consistently lower than 102 atoms/cm$^3$) and greater control over surface boron concentrations (the sub-maximal boron concentration at the surface of the wafers is due to thermal oxidation subsequent to diffusion).

These results indicate that a boron concentration profile can be controlled so as desired according to processing and design requirements, e.g., for minimizing contact resistance, suppressing surface recombination and the like.

After an RCA clean according to standard procedures, wafers were immersed in a quinhydmne solution (3% in isopropanol) in order to effect surface passivation, and effective surface recombination (S$_{eff}$) was measured using a quasi-steady state photo-conductance method. Without being bound by any particular theory, it is believed that performance of wafers with low boron concentration (e.g., as described herein) can be considerably enhanced in a convenient manner by surface passivation (e.g., with quinhydrone) to lower S$_{eff}$; whereas over-doped wafers (e.g., such as prepared using a spin-on technique) have a relatively low S$_{eff}$ (albeit higher than S$_{eff}$ values exemplified herein) without any additional treatment (due to the presence of SiB) and therefore cannot be readily improved by surface passivation. Wafers prepared by the spin-on technique were therefore not immersed in quinhydrone solution.

As shown in Table 1, controllable doping using boron sputtering resulted in a considerable reduction of surface recombination losses.

TABLE 1

Effective surface recombination of silicon wafers following boron sputtering and surface passivation via immersion in quinhydrone

| Boron deposition technique | Sheet resistance (ohms/□) | Surface boron concentration (atoms/cm$^3$) | Thickness of doped layer (μm) | Effective surface recombination velocity ($S_{\mathit{eff}}$) (cm/second) |
|---|---|---|---|---|
| Sputtering | 390 | $1.7 \times 10^{18}$ | 0.5 | 7.1 |
| Sputtering | 330 | $5 \times 10^{18}$ | 0.5 | 4.9 |
| Sputtering | 31 | $1.1 \times 10^{19}$ | 1.3 | 37.8 |
| Sputtering | 51 | $3 \times 10^{19}$ | 1.3 | 7 |
| Sputtering | 25 | $6 \times 10^{19}$ | 1.3 | 51 |
| Spin-on-without quinhydrone immersion (comparative example) | 28 | $10^{22}$ | 1.3 | 80 |

Example 3 p$^+$-p-n$^+$ Semiconductor Structure with Controlled Formation of p$^+$-Layers p-Type silicon wafers were doped using sputtered boron containing layers of various thicknesses, according to procedures described in Example 2, except that only the rear side was doped with boron. The front side was doped with phosphorus by thermal diffusion (simultaneously with boron doping of the rear side) to form an n$^+$ layer, which was removed upon texturization of the front side by etching (e.g., as described in Russian Patent No. 2139601). A p-n junction was formed by phosphorus diffusion (via POCl$_3$ diffusion) to form a second n$^+$ layer. The sheet resistance of the obtained (second) n$^+$ layers was ~80 ohms per square.

After forming a p$^+$-p-n$^+$ semiconductor structure, passivation of both surfaces, and deposition of antireflective SiN coatings, the implied open circuit voltage ($V_{oci}$) was determined at one sun illumination was determined by quasi-steady state photo-conductivity decay using a Sinton device. $V_{oci}$ values for several representative samples are presented in Table 2.

TABLE 2

Implied open circuit voltage ($V_{oci}$) for p$^+$-p-n$^+$ structures obtained using sputtering for boron doping

| p$^+$ layer sheet resistance (ohms per square) | Implied open circuit voltage-$V_{oci}$ (mV) |
|---|---|
| 300 | 663 |
| 300 | 667 |
| 90 | 692 |
| 50 | 685 |
| 30 | 671 |
| 23 | 669 |

As shown in Table 2, the obtained p$^+$-p-n$^+$ semiconductor structures exhibited a high quality, with high $V_{oci}$ values suitable for manufacturing photovoltaic cells with an efficiency of at least 22%.

Example 4

Photovoltaic Cells with Controlled Formation of p-Layers

Two groups of p-type Si wafers were processed according to procedures described in Example 3, to form photovoltaic cells. The two groups differed in the following respect: p-n junction formation (by POCl$_3$ gas phase diffusion to form a second n$^+$ layer) was performed in group 1 wafers before deposition of a SiN antireflective layer on the boron-doped side, and in group 2 wafers after deposition of the SiN antireflective layer on the boron-doped side. After phosphorus diffusion, deposition of a passivation/antireflective coating on the n$^+$ side, contact printing and firing, cell performance was assessed under standard conditions. Photovoltaic cell performance parameters for group 2 and for group 1 are presented n Tables 3 and 4, respectively.

TABLE 3

Parameters of photovoltaic cells with p-n junction formed subsequent to rear antireflective layer deposition

| Short circuit current density-J (mA/cm$^2$) | Open circuit voltage-$V_{oc}$ (mV) | Efficiency (%) | Back-to-front short circuit current ratio (%) | Shunt resistance (ohms) |
|---|---|---|---|---|
| 39.0 | 660 | 20.4 | 87.6 | 22.0 |
| 36.8 | 625 | 18.1 | 85.4 | 15.0 |
| 39.0 | 646 | 19.8 | 87.1 | 20.0 |
| 39.1 | 651 | 20.0 | 88.5 | 33.7 |
| 39.1 | 658 | 20.2 | 89.7 | 22.7 |

TABLE 4

Parameters of photovoltaic cells with p-n junction formed prior to rear antireflective layer deposition

| Short circuit current density-J (mA/cm$^2$) | Open circuit voltage-$V_{oc}$ (mV) | Efficiency (%) | Back-to-front short circuit ratio (%) | Shunt resistance (ohms) |
|---|---|---|---|---|
| 37.8 | 631 | 12.4 | 89.1 | 1.3 |
| 38.1 | 632 | 12.9 | 88.0 | 1.7 |
| 38.5 | 639 | 14.1 | 86.2 | 2.8 |
| 38.8 | 609 | 9.8 | 90.2 | 0.6 |
| 38.9 | 640 | 14.2 | 90.7 | 4.1 |

As shown in Tables 3 and 4, formation of an n$^+$ layer/p-n junction by gas diffusion subsequently to deposition of a rear antireflection layer (Table 3) resulted in considerably enhanced efficacy associated with a significantly increased shunt resistance.

In contrast, upon phosphorus diffusion prior to rear antireflection layer deposition (Table 4), additional measures are desired in order to reduce edge shunting.

Without being bound by any particular theory, it is believed that coverage of the boron-doped regions by the antireflection layer reduced shunting associated with contact between the boron-doped regions and the subsequently formed (second) n$^+$ layer.

These results indicate that high efficiency photovoltaic cells can be prepared according to procedures described herein. Further improvements are expected upon routine optimization, in view of the high implied open circuit voltages described in Example 3.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

The invention claimed is:

1. A bifacial photovoltaic cell comprising:
   a semiconductor substrate, said substrate comprising an n+ layer on a first surface thereof and a p+ layer on a second surface thereof, said n+ layer comprising an n-dopant and said p+ layer comprising a p-dopant;
   a passivating and/or antireflective coating on said doped first and said doped second surface;
   characterized in that said second surface of said semiconductor substrate has an area devoid of said p-dopant on an edge of said second surface having a width in the range of 0.1-0.5 mm, wherein said area is formed by etching the semiconductor substrate, and a ratio of back side short circuit current to front side short circuit current is at least 0.8.

2. The bifacial photovoltaic cell according to claim 1, wherein said n+ layer is characterized by a sheet resistance in a range of from 70 to 150 ohms.

3. The bifacial photovoltaic cell according to claim 1, further comprising electrical contacts on each of said first surface and said second surface.

4. The bifacial photovoltaic cell according to claim 1 wherein said p-dopant-containing layer has a greater thickness in some regions of said second surface and comprises electrical contacts on said regions of said second surface.

5. The bifacial photovoltaic cell according to claim 1, wherein said semiconductor substrate is a p-type semiconductor, and optionally said semiconductor substrate comprises silicon.

6. The bifacial photovoltaic cell according to claim 1, wherein the concentration of boron in said second surface is less than $3 \cdot 10^{20}$ atoms/cm$^3$.

7. The bifacial photovoltaic cell according to claim 6, wherein said second surface comprises from $10^{14}$ to $10^{16}$ boron atoms per cm$^2$.

8. The bifacial photovoltaic cell according to claim 1, wherein said second surface comprising the p+ layer doped with boron and is characterized by a thickness in a range of from 0.3 to 1.5 um.

9. The bifacial photovoltaic cell according to claim 1, wherein said second surface comprising the p+ layer doped with boron and is characterized by a sheet resistance in a range of from 30 to 150 ohms.

10. The bifacial photovoltaic cell according to claim 1, wherein said n-dopant comprises phosphorus, and said p-dopant comprises boron.

11. The bifacial photovoltaic cell according to claim 10, wherein a variability of boron concentration in said p+ layer, as determined by measuring sheet resistance of said p+ layer, is no more than 5%.

12. The bifacial photovoltaic cell according to claim 1, wherein said first surface is texturized.

13. The bifacial photovoltaic cell according to claim 1, wherein an effective back surface recombination of the bifacial photovoltaic cell is less than 50 cm/second.

14. The bifacial photovoltaic cell according to claim 1, characterized by a front side efficiency of at least 19%.

* * * * *